(12) United States Patent
Ogura et al.

(10) Patent No.: US 8,708,587 B2
(45) Date of Patent: Apr. 29, 2014

(54) SUBSTRATE TREATING APPARATUS WITH INTER-UNIT BUFFERS

(71) Applicant: Sokudo, Co., Ltd., Kyoto (JP)

(72) Inventors: Hiroyuki Ogura, Kyoto (JP); Kenya Morinishi, Kyoto (JP); Tsuyoshi Mitsuhashi, Kyoto (JP); Yasuo Kawamatsu, Kyoto (JP); Yoshiteru Fukutomi, Kyoto (JP); Hiromichi Nagashima, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 0 days.

(21) Appl. No.: 14/011,993

(22) Filed: Aug. 28, 2013

(65) Prior Publication Data

US 2014/0000514 A1 Jan. 2, 2014

Related U.S. Application Data

(63) Continuation of application No. 12/324,794, filed on Nov. 26, 2008, now Pat. No. 8,545,118.

(30) Foreign Application Priority Data

Nov. 30, 2007 (JP) .................................. 2007-310676

(51) Int. Cl.
*G03D 5/00* (2006.01)
(52) U.S. Cl.
USPC .......................................................... 396/611
(58) Field of Classification Search
USPC .......................................................... 396/611
See application file for complete search history.

(56) References Cited

U.S. PATENT DOCUMENTS

| 5,177,514 | A | 1/1993 | Ushijima et al. |
| 5,202,716 | A | 4/1993 | Tateyama et al. |
| 5,430,271 | A | 7/1995 | Orgami et al. |
| 5,565,034 | A | 10/1996 | Nanbu et al. |
| 5,571,325 | A | 11/1996 | Ueyama et al. |
| 5,664,254 | A | 9/1997 | Ohkura et al. |

(Continued)

FOREIGN PATENT DOCUMENTS

| CN | 1773672 | 5/2006 |
| JP | H01-241840 A1 | 9/1989 |

(Continued)

OTHER PUBLICATIONS

Invalidation Trial for corresponding Korean Patent No. 10-1170211 dated Aug. 7, 2013, 26 pages.

(Continued)

*Primary Examiner* — Rodney Fuller
(74) *Attorney, Agent, or Firm* — Kilpatrick Townsend & Stockton LLP

(57) ABSTRACT

The invention provides coating units, heat-treating units, and a first main transport mechanism for transporting substrates to each of these treating units. The substrates are transferred from the first main transport mechanism to a second main transport mechanism through a receiver. When a substrate cannot be placed on the receiver, this substrate is placed on a buffer. Thus, the first main transport mechanism can continue transporting other substrates. The other substrates in the treating units are transported between the treating units without delay, to receive a series of treatments including coating treatment and heat treatment as scheduled. This prevents lowering of the quality of treatment for forming film on the substrates.

20 Claims, 13 Drawing Sheets

(56) References Cited

U.S. PATENT DOCUMENTS

| | | |
|---|---|---|
| 5,668,733 A | 9/1997 | Morimoto et al. |
| 5,677,758 A | 10/1997 | McEachern et al. |
| 5,725,664 A | 3/1998 | Nanbu et al. |
| 5,803,932 A | 9/1998 | Akimoto et al. |
| 5,826,129 A | 10/1998 | Hasebe et al. |
| 5,844,662 A | 12/1998 | Akimoto et al. |
| 5,937,223 A | 8/1999 | Akimoto et al. |
| 5,972,110 A | 10/1999 | Akimoto |
| 6,062,798 A | 5/2000 | Muka |
| 6,099,643 A | 8/2000 | Ohtani et al. |
| 6,161,969 A | 12/2000 | Kimura et al. |
| 6,176,667 B1 | 1/2001 | Fairbairn et al. |
| 6,264,748 B1 | 7/2001 | Kuriki et al. |
| 6,270,306 B1 | 8/2001 | Otwell et al. |
| 6,287,025 B1 | 9/2001 | Matsuyama |
| 6,338,582 B1 | 1/2002 | Ueda |
| 6,377,329 B1 | 4/2002 | Takekuma |
| 6,382,895 B1 | 5/2002 | Konishi et al. |
| 6,426,303 B1 | 7/2002 | Ueda |
| 6,444,029 B1 | 9/2002 | Kimura et al. |
| 6,454,472 B1 | 9/2002 | Kim et al. |
| 6,491,451 B1 | 12/2002 | Stanley et al. |
| 6,558,053 B2 | 5/2003 | Shigemori et al. |
| 6,680,775 B1 | 1/2004 | Hirakawa |
| 6,752,543 B2 | 6/2004 | Fukutomi et al. |
| 6,758,647 B2 | 7/2004 | Kaji et al. |
| 6,832,863 B2 | 12/2004 | Matsunaga et al. |
| 6,893,171 B2 | 5/2005 | Fukutomi et al. |
| 6,937,917 B2 | 8/2005 | Akiyama et al. |
| 6,955,595 B2 | 10/2005 | Kim |
| 7,001,674 B2 | 2/2006 | Irie |
| 7,008,124 B2 | 3/2006 | Miyata |
| 7,017,658 B2 | 3/2006 | Hisai et al. |
| 7,053,990 B2 | 5/2006 | Galburt et al. |
| 7,069,099 B2 | 6/2006 | Hashinoki et al. |
| 7,241,061 B2 | 7/2007 | Akimoto et al. |
| 7,245,348 B2 | 7/2007 | Akimoto et al. |
| 7,262,829 B2 | 8/2007 | Hayashida et al. |
| 7,279,067 B2 | 10/2007 | Yoshida et al. |
| 7,317,961 B2 | 1/2008 | Hashinoki et al. |
| 7,322,756 B2 | 1/2008 | Akimoto et al. |
| 7,323,060 B2 * | 1/2008 | Yamada et al. ............... 118/500 |
| 7,497,633 B2 | 3/2009 | Kaneyama et al. |
| 7,522,823 B2 | 4/2009 | Fukumoto et al. |
| 7,525,650 B2 | 4/2009 | Shiga et al. |
| 7,537,401 B2 | 5/2009 | Kim et al. |
| 7,549,811 B2 | 6/2009 | Yamada et al. |
| 7,604,424 B2 | 10/2009 | Shigemori et al. |
| 7,641,405 B2 | 1/2010 | Fukutomi |
| 7,645,081 B2 | 1/2010 | Hara et al. |
| 7,651,306 B2 | 1/2010 | Rice et al. |
| 7,686,559 B2 | 3/2010 | Tsujimoto et al. |
| 7,729,798 B2 | 6/2010 | Hayashida et al. |
| 7,758,341 B2 | 7/2010 | Dong-Hun |
| 7,809,460 B2 | 10/2010 | Ishida et al. |
| 7,819,079 B2 | 10/2010 | Englhardt et al. |
| 7,836,845 B2 | 11/2010 | Tanoue et al. |
| 7,841,072 B2 | 11/2010 | Matsuoka et al. |
| 7,925,377 B2 | 4/2011 | Ishikawa et al. |
| 7,934,880 B2 | 5/2011 | Hara et al. |
| 8,034,190 B2 | 10/2011 | Yasuda et al. |
| 8,154,106 B2 | 4/2012 | Ishida et al. |
| 8,289,496 B2 | 10/2012 | Kim et al. |
| 8,342,761 B2 | 1/2013 | Matsuoka |
| 8,545,118 B2 | 10/2013 | Ogura et al. |
| 2001/0013161 A1 | 8/2001 | Kitano et al. |
| 2002/0011207 A1 | 1/2002 | Uzawa et al. |
| 2002/0053319 A1 | 5/2002 | Nagamine |
| 2003/0147643 A1 | 8/2003 | Miyata et al. |
| 2003/0216053 A1 | 11/2003 | Miyata |
| 2004/0122545 A1 | 6/2004 | Akiyama et al. |
| 2004/0182318 A1 | 9/2004 | Hashinoki et al. |
| 2005/0030511 A1 | 2/2005 | Auer-Jongepier et al. |
| 2005/0042555 A1 | 2/2005 | Matsushita et al. |
| 2005/0135905 A1 | 6/2005 | Moriya et al. |
| 2006/0011296 A1 | 1/2006 | Higashi et al. |
| 2006/0028630 A1 | 2/2006 | Akimoto |
| 2006/0062282 A1 | 3/2006 | Wright |
| 2006/0098978 A1 | 5/2006 | Yasuda et al. |
| 2006/0104635 A1 | 5/2006 | Kaneyama et al. |
| 2006/0137726 A1 | 6/2006 | Sano et al. |
| 2006/0147202 A1 | 7/2006 | Yasuda et al. |
| 2006/0162858 A1 | 7/2006 | Akimoto et al. |
| 2006/0194445 A1 | 8/2006 | Hayashi et al. |
| 2006/0201423 A1 | 9/2006 | Akimoto et al. |
| 2006/0286300 A1 * | 12/2006 | Ishikawa et al. ............... 427/331 |
| 2007/0056514 A1 | 3/2007 | Akimoto et al. |
| 2007/0190437 A1 | 8/2007 | Kaneyama et al. |
| 2007/0274711 A1 | 11/2007 | Kaneyama et al. |
| 2007/0280680 A1 | 12/2007 | Kim et al. |
| 2008/0014333 A1 | 1/2008 | Matsuoka et al. |
| 2008/0026153 A1 | 1/2008 | Hayashida et al. |
| 2008/0070164 A1 | 3/2008 | Hayashida et al. |
| 2008/0129968 A1 | 6/2008 | Hayashida et al. |
| 2008/0212049 A1 | 9/2008 | Fukutomi et al. |
| 2008/0269937 A1 | 10/2008 | Yamamoto |
| 2009/0000543 A1 | 1/2009 | Fukutomi et al. |
| 2009/0001071 A1 | 1/2009 | Kulkarni |
| 2009/0098298 A1 | 4/2009 | Miyata et al. |
| 2009/0139450 A1 | 6/2009 | Ogura et al. |
| 2009/0139833 A1 | 6/2009 | Ogura |
| 2009/0142162 A1 | 6/2009 | Ogura et al. |
| 2009/0142713 A1 | 6/2009 | Yamamoto |
| 2009/0149982 A1 | 6/2009 | Higashi et al. |
| 2009/0165711 A1 | 7/2009 | Ogura et al. |
| 2009/0165712 A1 | 7/2009 | Ogura et al. |
| 2009/0165950 A1 | 7/2009 | Kim et al. |
| 2010/0050940 A1 | 3/2010 | Sahoda et al. |
| 2010/0061718 A1 | 3/2010 | Hara et al. |
| 2010/0136257 A1 | 6/2010 | Yasuda et al. |
| 2010/0195066 A1 | 8/2010 | Kim et al. |
| 2011/0043773 A1 | 2/2011 | Matsuoka |
| 2011/0063588 A1 | 3/2011 | Kashiyama et al. |
| 2012/0145073 A1 | 6/2012 | Fukutomi et al. |
| 2012/0145074 A1 | 6/2012 | Fukutomi et al. |
| 2012/0156380 A1 | 6/2012 | Fukutomi et al. |
| 2012/0307217 A1 | 12/2012 | Kim et al. |

FOREIGN PATENT DOCUMENTS

| | | |
|---|---|---|
| JP | H04-085812 A1 | 3/1992 |
| JP | H-085812 A1 | 3/1992 |
| JP | H06-5689 A1 | 1/1994 |
| JP | H06-89934 A1 | 3/1994 |
| JP | H07-283094 A1 | 10/1995 |
| JP | H09-045613 A1 | 2/1997 |
| JP | 09-199568 | 7/1997 |
| JP | H09-251953 A1 | 9/1997 |
| JP | 09-312323 A1 | 12/1997 |
| JP | H10-50794 A1 | 2/1998 |
| JP | H01-74822 A1 | 3/1998 |
| JP | H10-144673 A1 | 5/1998 |
| JP | 10-146744 A1 | 6/1998 |
| JP | 10-209241 | 7/1998 |
| JP | H10-189420 A1 | 7/1998 |
| JP | H10-261689 A1 | 9/1998 |
| JP | H10-294351 A1 | 11/1998 |
| JP | H10-335415 A1 | 12/1998 |
| JP | H11-16978 A1 | 1/1999 |
| JP | H11-251405 A1 | 9/1999 |
| JP | 11-340301 A | 12/1999 |
| JP | 2000-012443 | 1/2000 |
| JP | 2000-100886 A1 | 4/2000 |
| JP | 2000-124124 A1 | 4/2000 |
| JP | 2000-124129 A1 | 4/2000 |
| JP | 2000-200822 A1 | 7/2000 |
| JP | 2000-269297 A1 | 9/2000 |
| JP | 2000-331922 | 11/2000 |
| JP | 2001-093827 A1 | 6/2001 |
| JP | 03-211749 A | 9/2001 |
| JP | 2002-510141 A1 | 2/2002 |
| JP | 2003-224175 A1 | 8/2003 |
| JP | 2003-309160 A1 | 10/2003 |
| JP | 2003-324059 A1 | 11/2003 |

(56) References Cited

FOREIGN PATENT DOCUMENTS

| | | |
|---|---|---|
| JP | 2003-324139 | 11/2003 |
| JP | 2003-338496 A1 | 11/2003 |
| JP | 10-2004-31921 | 1/2004 |
| JP | 2004-15021 A1 | 1/2004 |
| JP | 2004-015023 A1 | 1/2004 |
| JP | 2004-087675 | 3/2004 |
| JP | 2004-046450 | 5/2004 |
| JP | 2004-152801 A1 | 5/2004 |
| JP | 2004-193597 A | 7/2004 |
| JP | 2004-200485 A1 | 7/2004 |
| JP | 2004-207279 A1 | 7/2004 |
| JP | 2004-241319 A1 | 8/2004 |
| JP | 2004-260129 | 9/2004 |
| JP | 3600711 | 9/2004 |
| JP | 2004-304003 A1 | 10/2004 |
| JP | 2004-311714 A1 | 11/2004 |
| JP | 2004-319767 A1 | 11/2004 |
| JP | 2005-57294 A1 | 3/2005 |
| JP | 2005-093920 A1 | 4/2005 |
| JP | 2005-123249 A1 | 5/2005 |
| JP | 2005-167083 A1 | 6/2005 |
| JP | 2005-243690 A1 | 9/2005 |
| JP | 2006-203075 | 8/2006 |
| JP | 2006-216614 A1 | 8/2006 |
| JP | 2006-228974 A1 | 8/2006 |
| JP | 2006-229183 A1 | 8/2006 |
| JP | 2006-253501 A1 | 9/2006 |
| JP | 2006-269672 A1 | 10/2006 |
| JP | 2006-335484 A1 | 12/2006 |
| JP | 2007-005659 A1 | 1/2007 |
| JP | 2007-288029 A1 | 1/2007 |
| JP | 2007-150071 A1 | 6/2007 |
| JP | 2007-158260 A1 | 6/2007 |
| JP | 2007-208064 A1 | 8/2007 |
| JP | 2007-227984 | 9/2007 |
| JP | 2007-287887 A1 | 11/2007 |
| JP | 2009-99577 A1 | 5/2009 |
| JP | 2009-164256 A1 | 7/2009 |
| JP | 2009-076893 A1 | 9/2009 |
| KR | 1997-0011065 A1 | 3/1997 |
| KR | 1999-0023624 A | 3/1999 |
| KR | 2001-0029862 A | 4/2001 |
| KR | 2002-0035758 | 5/2002 |
| KR | 10-0387418 B1 | 6/2003 |
| KR | 10-2003-0087418 A | 11/2003 |
| KR | 2003-0086900 A | 11/2003 |
| KR | 10-2004-0054517 A | 6/2004 |
| KR | 10-2005-0051280 A | 6/2005 |
| KR | 10-2006-0033423 A | 4/2006 |
| KR | 10-2006-0088495 A | 4/2006 |
| KR | 2006-0050112 A | 5/2006 |
| KR | 10-2006-0085188 A | 7/2006 |
| KR | 10-2006-0092061 A | 8/2006 |
| KR | 10-2006-0097613 A1 | 9/2006 |
| KR | 10-2007-0007262 A | 1/2007 |
| KR | 2007-0003328 A | 1/2007 |
| KR | 10-0698352 A | 3/2007 |
| KR | 10-2007-0062522 A | 6/2007 |
| TW | 200631680 | 9/2006 |

OTHER PUBLICATIONS

Final Office Action for U.S. Appl. No. 13/401,625 mailed Sep. 19, 2013, 11 pages.
Non-Final Office Action for U.S. Appl. No. 13/401,617 mailed Sep. 17, 2013, 8 pages.
Office Action for corresponding Chinese Application No. 200810102250.36.7 dated Sep. 18, 2009, 4 pages.
Office Action for corresponding Korean Application No. 10-2008-0060084 dated Mar. 9, 2010, 5 pages.
Notice of Allowance of Korean Application No. 10-2008-0118967 dated Oct. 21, 2010, 2 pages total.
Office Action for corresponding Korean Application No. 10-2008-0132304 mailed Oct. 25, 2010, 4 pages.
Office Action for corresponding Korean Application No. 10-2008-0132009 dated Jan. 18, 2011, 5 pages.
Invalidation Trial for corresponding Korean Patent No. 10-1001511 received on Apr. 13, 2011, 53 pages.
Notice of Allowance for corresponding Korean application No. 10-2010-0105888 dated Apr. 22, 2011, 3 pages.
Invalidation Trial for corresponding Korean Application No. 10-1010086 dated Apr. 25, 2011, 68 pages.
Office Action for corresponding Korean Application No. 10-2008-0132009 dated Jul. 21, 2011, 5 pages.
Office Action for corresponding Japanese Application No. 2007-172496 dated Sep. 27, 2011, 4 pages.
Invalidation Trial for corresponding Korean Patent No. 10-1036420 received on Sep. 27, 2011, 36 pages.
Office Action for corresponding Japanese Application No. 2007-340427 dated Oct. 4, 2011, 2 pages.
Office Action for corresponding Japanese Application No. 2007-340428 dated Oct. 4, 2011, 2 pages.
Invalidation Trial for corresponding Korean Patent No. 10-1047799 (Korean Patent application No. 10-2008-132304) received on Nov. 16, 2011, 69 pages.
Office Action for corresponding Japanese Application No. 2008-076610 dated Jan. 10, 2012, 2 pages.
Office Action for corresponding Japanese Application No. 2008-076611 dated Jan. 10, 2012, 2 pages.
Office Action for corresponding Japanese Application No. 2008-076608 dated Jan. 17, 2012, 4 pages.
Office Action for corresponding Taiwanese Application No. 097150911 dated Apr. 10, 2012, 6 pages.
Office Action for corresponding Japanese Application No. 2007-340428 dated Apr. 24, 2012, 3 pages.
Office Action for corresponding Japanese Application No. 2007-310676 dated May 8, 2012, 3 pages.
Office Action for corresponding Japanese Application No. 2007-310677 dated May 8, 2012, 4 pages.
Office Action for corresponding Taiwanese Application No. 097150912 dated Jun. 1, 2012, 6 pages.
Notice of Allowance for corresponding Korean Patent Application No. 10-2008-0132009 dated Jun. 22, 2012, 3 pages.
Office Action for corresponding Japanese Application No. 2007-310675 dated Jul. 31, 2012, 3 pages.
Decision of Patent for corresponding Japanese Patent Application No. 2007-310677 dated Oct. 16, 2012, 3 pages.
Office Action for corresponding Korean Patent Application No. 10-2012-0005204 dated Nov. 1, 2012, 6 pages.
Office Action for corresponding Japanese Patent Application No. 2008-327897 dated Nov. 6, 2012, 4 pages.
Office Action for corresponding Japanese Patent Application No. 2007-340430 dated Dec. 18, 2012, 3 pages.
Information Statement for corresponding Japanese Patent Application No. 2007-310676 dated Jan. 15, 2013, 4 pages.
Office Action for corresponding Japanese Patent Application No. 2011-265835 dated Apr. 23, 2013, 3 pages.
Invalidation Trial for corresponding Korean Patent No. 10-1213284 dated Jul. 3, 2013, 31 pages.
Invalidation trial for corresponding Taiwanese Patent No. 97124376 dated Jul. 30, 2013, 43 pages.
Trial Decision for corresponding Korean Patent No. 10-1047799 dated Jun. 25, 2013, 125 pages.
Office Action for corresponding Japanese Patent Application No. 2012-118585 dated Jun. 25, 2013, 3 pages.
Office Action for corresponding Japanese Patent Application No. 2011-257538 dated Jul. 2, 2013, 3 pages.
Non-Final Office Action for U.S. Appl. No. 12/324,788 mailed May 27, 2011, 41 pages.
Non-Final Office Action for U.S. Appl. No. 12/163,951 mailed Jul. 11, 2011, 18 pages.
Non-Final Office Action for U.S. Appl. No. 12/343,302 mailed Aug. 19, 2011, 26 pages.
Non-Final Office Action for U.S. Appl. No. 12/324,802 mailed Sep. 14, 2011, 13 pages.
Non-Final Office Action for U.S. Appl. No. 12/343,292 mailed Oct. 28, 2011, 12 pages.

(56) References Cited

OTHER PUBLICATIONS

Final Office Action for U.S. Appl. No. 12/324,788 mailed Dec. 7, 2011, 26 pages.
Final Office Action for U.S. Appl. No. 12/163,951 mailed Jan. 19, 2012, 22 pages.
Non-Final Office Action for U.S. Appl. No. 12/324,794 mailed Feb. 3, 2012, 8 pages.
Final Office Action for U.S. Appl. No. 12/343,302 mailed Apr. 12, 2012, 33 pages.
Final Office Action for U.S. Appl. No. 12/324,802 mailed Apr. 20, 2012, 14 pages.
Final Office Action for U.S. Appl. No. 12/343,292 mailed Jun. 1, 2012, 15 pages.
Advisory Action for U.S. Appl. No. 12/343,292 mailed Oct. 12, 2012, 3 pages.
Non-Final Office Action for U.S. Appl. No. 13/401,625 mailed Mar. 14, 2013, 8 pages.
Notice of Allowance for U.S. Appl. No. 12/324,794 mailed May 29, 2013, 7 pages.
Non-Final Office Action for U.S. Appl. No. 13/401,644 mailed Jun. 21, 2013, 16 pages.
Office Action for corresponding Japanese Patent Application No. 2012-118584 dated Oct. 22, 2013, 2 pages.
Office Action for corresponding Japanese Patent Application No. 2011-257538, dated Dec. 3, 2013, 3 pages.
Invalidation Trial for corresponding Korean Patent No. 10-1276946, dated Nov. 12, 2013, 52 pages.

* cited by examiner

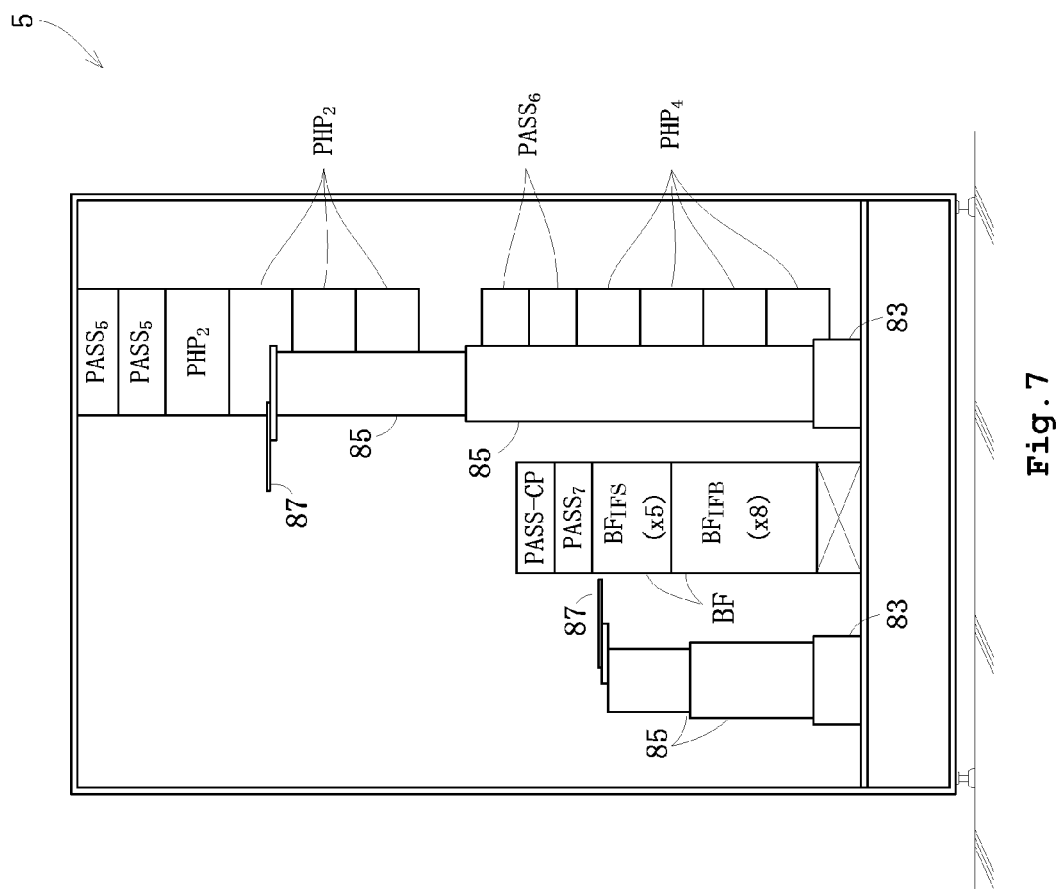

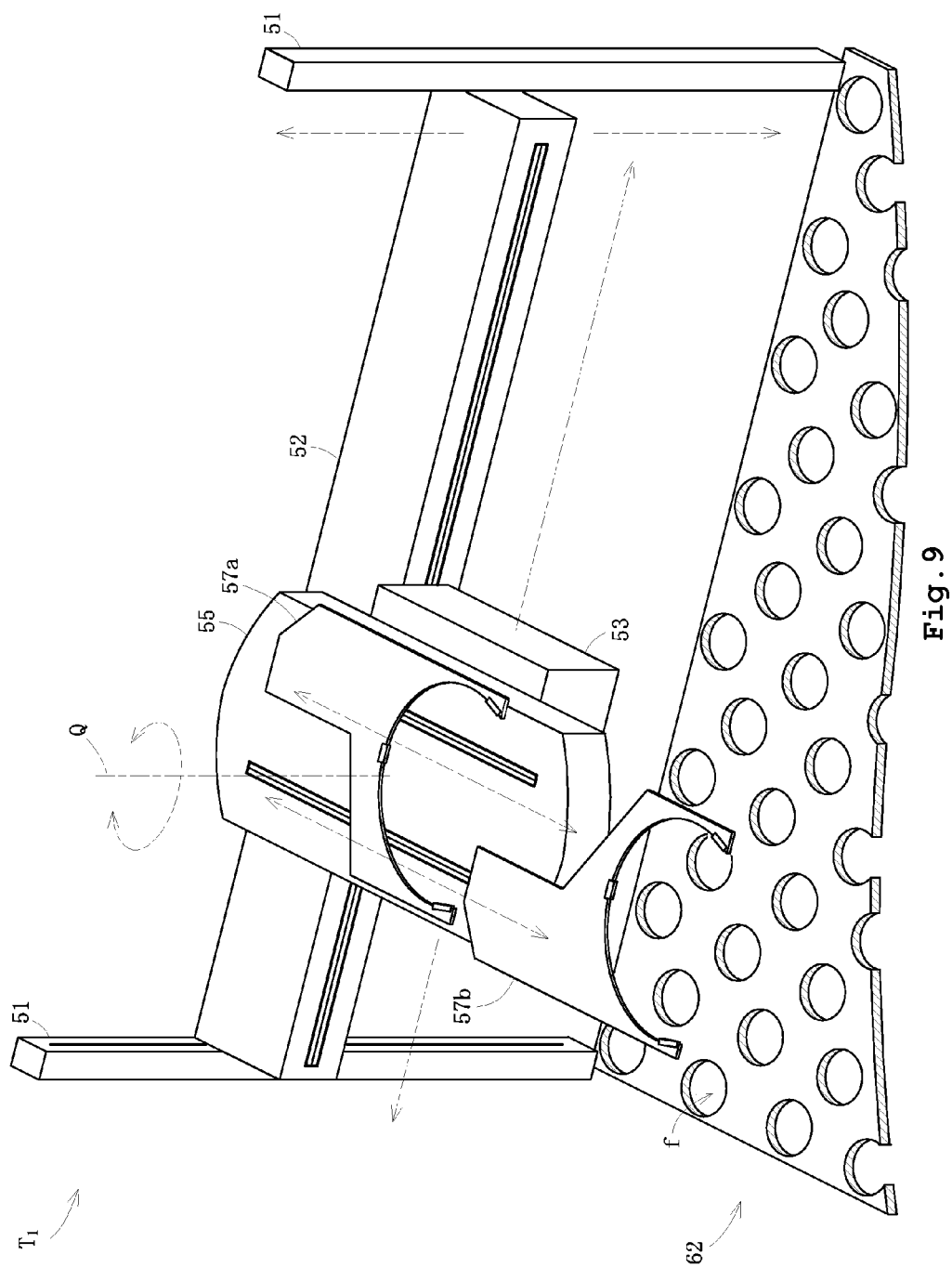

SUBSTRATE TREATING APPARATUS WITH INTER-UNIT BUFFERS

CROSS-REFERENCES TO RELATED APPLICATIONS

This application is a Continuation of U.S. patent application Ser. No. 12/324,794, filed on Nov. 26, 2008, which claims priority to Japanese Patent Application No. JP2007-310676, filed on Nov. 30, 2007, the entire disclosure of which is hereby incorporated by reference its entirety for all purposes.

BACKGROUND OF THE INVENTION

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

Conventionally, this type of substrate treating apparatus is used to form a resist film on substrates, and develop the substrates exposed in a separate exposing machine. The apparatus includes a treating section having arranged therein at least a coating block for forming film such as resist film, a developing block for developing the substrates, and. Each treating block includes a single main transport mechanism and various treating units. The treating units of the coating block include coating units for applying treating solutions to the substrates, and heat-treating units for heat-treating the substrates. The main transport mechanism of each block, while transporting substrates to the treating units in that block, transfers the substrates through receivers to and from the main transport mechanism of another adjacent treating block, to carry out a series of treatments of the substrates (as disclosed in Japanese Unexamined Patent Publication No. 2003-324139, for example).

The conventional apparatus with such a construction has the following drawbacks.

In the conventional apparatus, when the main transport mechanism of the coating block transfers a substrate to the other adjacent main transport mechanism, the substrate cannot be placed on a receiver if, for example, a different substrate is present on that receiver. In such a case, the main transport mechanism of the coating block stands by until the receiver becomes capable of receiving the substrate. While the main transport mechanism of the coating block is on standby, the main transport mechanism does not transport substrates between the treating units of the coating block. For example, even when a substrate has been treated in a coating unit, this substrate is not transported to another treating unit such as a heat-treating unit. Therefore, the coating block cannot carry out a series of treatments including coating treatment and heat treatment in a predetermined time. As a result, there is an inconvenience of lowering the quality of treatment of the substrates.

SUMMARY OF THE INVENTION

This invention has been made having regard to the state of the art noted above, and its object is to provide a substrate treating apparatus that can prevent lowering the quality of treatment for forming film on substrates.

The above object is fulfilled, according to one embodiment of this invention, by a substrate treating apparatus comprising a film forming section for forming film on substrates, including coating units for applying a treating solution to the substrates, and heat-treating units for heat-treating the substrates; a first main transport mechanism for transporting the substrates to and from the coating units and the heat-treating units; a receiver for receiving the substrates in order to transfer the substrates having the film formed thereon in the film forming section from the first main transport mechanism to a different main transport mechanism; and a buffer disposed adjacent the receiver for temporarily holding the substrates.

According to this embodiment, since the buffer is provided adjacent to the receiver, even when the first main transport mechanism cannot place a substrate on the receiver, the first main transport mechanism can place that substrate on the buffer. Thus, the first main transport mechanism can continue transporting substrates. That is, other substrates can be transported to the coating units and heat-treating units without delay. The film forming section can carry out a series of treatments including coating treatment in the coating units and heat treatment in the heat-treating units for a plurality of substrates on time (as scheduled). This can prevent lowering of the quality of treatment to form film on the substrates.

In the embodiment noted above, the first main transport mechanism may be arranged to place the substrates temporarily on the buffer when the first main transport mechanism cannot place the substrates on the receiver. The first main transport mechanism places the substrates on the buffer when unable to place the substrates on the receiver, to be able to start other substrate transporting operations promptly. Thus, the treatment in progress in the film forming section can be continued on time (as scheduled). This can prevent lowering of the quality of treatment to form film on the substrates.

In the embodiment noted above, the different main transport mechanism may be permitted to receive the substrates placed on the buffer. Then, the substrates can be transported efficiently since this arrangement does not require the first main transport mechanism to transport the substrates from the buffer to the receiver in order to transfer the substrates placed on the buffer to the different main transport mechanism.

In the embodiment noted above, the different main transport mechanism may be permitted to place the substrates on the receiver in order to transfer the substrates to the first main transport mechanism, and also permitted to place the substrates temporarily on the buffer. Then, the substrates can also be transferred from the different main transport mechanism to the first main transport mechanism through the receiver, and in addition the different main transport mechanism also can place the substrates temporarily on the buffer. No delay will occur in the substrate transport by the different main transport mechanism even when the different main transport mechanism cannot place the substrates on the receiver for transferring the substrates from the different main transport mechanism to the first main transport mechanism. Thus, there is no possibility of adversely affecting the quality of substrate treatment.

The different transport mechanism may be arranged to place the substrates temporarily on the buffer when the different main transport mechanism cannot place the substrates on the receiver. Since the different main transport mechanism places the substrates on the buffer when unable to place the substrates on the receiver, there will occur no delay in the substrate transport by the different main transport mechanism.

The buffer may be stacked with the receiver. Then, the first main transport mechanism can selectively access both the receiver and buffer only by moving vertically.

In the embodiment noted above, the buffer may be disposed in at least one of positions over and under the receiver.

Then, the first main transport mechanism can selectively access both the receiver and buffer only by moving up and down.

In the embodiment noted above, the buffer may be arranged to accommodate the substrates corresponding in number at least to the number of substrates that can be treated simultaneously in the film forming section. Then, all the substrates that can be treated simultaneously in the film forming section can be placed temporarily on the buffer. Therefore, at whatever time it may become impossible to place the substrates on the receiver, the first main transport mechanism can smoothly transport all the substrates being treated in the film forming section at that time. The series of treatments in the film forming section can be completed for each substrate as usual. Thus, even when it becomes impossible to place the substrates on the receiver while the film forming section is treating the substrates, there is no possibility of lowering the quality of ongoing treatment of the substrates.

The buffer may be arranged to accommodate the substrates corresponding in number at least to the number of coating units. Even when the first main transport mechanism becomes unable to place the substrates on the receiver while the substrates are being treated in the coating units, the first main transport mechanism can transport, at predetermined times, all the substrates being treated in the coating units. Thus, even when it becomes impossible to place the substrates on the receiver while the coating units are treating the substrates, there is no possibility of lowering the quality of ongoing treatment of the substrates.

In the embodiment noted above, the film forming section may be arranged to form resist film on the substrates. Then, resist film can be formed on the substrates with high quality.

The film forming section is arranged to form also anti-reflection film on the substrates. Then, anti-reflection film can be formed on the substrates with high quality.

In another aspect of the embodiment, a substrate treating apparatus comprises a film forming section for forming film on substrates, including coating units for applying a treating solution to the substrates and heat-treating units for heat-treating the substrates; a first main transport mechanism for transporting the substrates to and from the coating units and the heat-treating units; a receiver for receiving the substrates in order to transfer the substrates from the first main transport mechanism to a different main transport mechanism; a buffer disposed adjacent the receiver for temporarily holding the substrates; and a controller for controlling the first main transport mechanism to place on the receiver the substrates to be transferred to the other main transport mechanism, and to place the substrates temporarily on the buffer at an abnormal time when the substrates cannot be placed on the receiver.

According to this embodiment, the first main transport mechanism transports the substrates to and from the coating units and the heat-treating units. The coating units apply a treating solution to the substrates, and the heat-treating units heat-treat the substrates. As a result, film is formed on the substrates. When the substrates can be placed on the receiver, the first main transport mechanism places the substrates with film formed thereon on the receiver to transfer the substrates to the different main transport mechanism. At an abnormal time when the substrates cannot be placed on the receiver, the first main transport mechanism places the substrates temporarily on the buffer. The controller controls the substrate transport of the first main transport mechanism to the receiver and the buffer. Therefore, whether an abnormal time or not, there occurs no delay in the substrate transport by the first main transport mechanism. The treatments in the coating units and heat-treating units can be carried out for the substrates on time (as scheduled). This can prevent lowering of the quality of treatment to form film on the substrates.

In the embodiment noted above, the apparatus may further comprise a first detector for detecting the substrates placed on the receiver; wherein the controller is arranged to cause the substrates to be placed temporarily on the buffer when, in transferring the substrates from the first main transport mechanism to the different main transport mechanism, the controller determines from a result of detection by the first detector that one of the substrates is present on the receiver. With the first detector provided, the controller can reliably determine whether or not this is an abnormal time when the substrates cannot be placed on the receiver.

In the embodiment noted above, the controller may be arranged, when causing the first main transport mechanism to place the substrates temporarily on the buffer, to cause the different main transport mechanism to receive the substrates placed on the buffer. Then, the substrates can be transported efficiently since this arrangement does not require the first main transport mechanism to transport the substrates from the buffer to the receiver in order to transfer the substrates placed on the buffer to the different main transport mechanism.

In a further aspect of the embodiment, a substrate treating apparatus comprises a resist film coating block including resist film coating units for applying a resist film material to substrates and heat-treating units for heat-treating the substrates; a first main transport mechanism transporting the substrates to and from the resist film coating units and the heat-treating units; a developing block disposed adjacent the resist film coating blocks, the developing block including developing units for supplying a developer to the substrates and heat-treating units for heat-treating the substrates; a second main transport mechanism for transporting the substrates to and from the developing units and the heat-treating units; and an interface section disposed adjacent the developing block, and including an interface transport mechanism for transporting the substrates to and from an exposing machine provided separately from the apparatus; wherein the first main transport mechanism and the second main transport mechanism transfer the substrates through a first receiver arranged to receive the substrates, and the first main transport mechanism is arranged, when unable to place the substrates on the first receiver, to place the substrates temporarily on a first buffer.

According to this embodiment, in the resist film coating block, the first main transport mechanism transports the substrates to and from the resist film coating units and the heat-treating units, and each treating unit carries out a predetermined treatment of the substrates. As a result, resist film is formed on the substrates. The first main transport mechanism transfers the substrates with resist film formed thereon to the second main transport mechanism of the developing block. The substrates transported to the developing block are further transported through the interface section to the exposing machine to be exposed therein. The exposed substrates are transported through the interface section to the developing block. In the developing block, the second main transport mechanism transports the substrates to the developing units and heat-treating units, and each treating unit carries out a predetermined treatment for the substrates. As a result, the substrates are developed. The second main transport mechanism transfers the developed substrates to the first main transport mechanism.

The first main transport mechanism and second main transport mechanism transfer the substrates between the transport mechanisms through the first receiver. When a substrate cannot be placed on the first receiver, the first main transport mechanism places the substrate temporarily on the first buffer. Thus, the first main transport mechanism can transport other substrates to and from the resist film coating units and the heat-treating units without delay. The treatments in the resist film coating units and heat-treating units can be carried out for the substrates on time (as scheduled). This can prevent lowering of the quality of treatment in the resist film coating block.

In the embodiment noted above, the first buffer may be disposed adjacent and above or below the first receiver. Then, the first main transport mechanism can selectively access both the receiver and buffer only by moving vertically.

In the embodiment noted above, each of the resist film coating block and the developing block may be divided into stories arranged vertically. The resist film coating units, the first main transport mechanism, and the heat-treating units of the resist film coating block may be arranged on each story of the resist film coating block; the developing units, the second main transport mechanism and the heat-treating units of the developing block may be arranged on each story of the developing block; the first receiver may be provided for each story between the resist film coating block and the developing block; and the first buffer may be provided for each first receiver. A series of treatments is carried out for the substrates in parallel on each story of the resist film coating block, and a series of treatments is carried out for the substrates in parallel on each story of the developing block. This can increase throughput of the substrate treating apparatus. The stories are arranged one over the other to form a layered structure with pluralities of first and second main transport mechanisms and various treating units arranged vertically, which can avoid an enlarged installation area of the substrate treating apparatus.

In the embodiment noted above, the interface transport mechanism may be arranged to transport the substrates to the heat-treating units of the developing block where the heat-treating units carry out post-exposure baking (PEB) treatment of the substrates exposed; the interface transport mechanism and the second main transport mechanism may transfer the substrates through a second receiver for receiving the substrates; and the interface transport mechanism may be arranged, when unable to place the substrates on the second receiver, to place the substrates temporarily on a second buffer. The interface transport mechanism receives the substrates from the exposing machine and transports the substrates to the heat-treating units of the developing block. The heat-treating units of the developing block carry out post-exposure baking (PEB) treatment for the substrates. After the post-exposure baking (PEB) treatment, the interface transport mechanism transports the substrates from the heat-treating units of the developing block to the developing block.

The interface transport mechanism and the second main transport mechanism of the developing block transfer the substrates between the transport mechanisms through the second receiver. When a substrate cannot be placed on the second receiver, the interface transport mechanism places the substrate temporarily on the second buffer. Thus, the interface transport mechanism can promptly start transporting other substrates. Specifically, the interface transport mechanism can unload the substrates having undergone the post-exposure baking (PEB) treatment from the heat-treating units of the developing block on time (as scheduled). This can prevent lowering of the quality of post-exposure baking (PEB) treatment given to the substrates.

In the embodiment noted above, the second buffer may be provided in the interface section. Then, the interface transport mechanism can access the second buffer easily.

In the embodiment noted above, the resist film coating block may further include anti-reflection film coating units for applying a treating solution for anti-reflection film to the substrates. Then, anti-reflection film can be formed on the substrates with high quality.

This specification discloses embodiments directed to the following substrate treating apparatus:

(1) The substrate treating apparatus according to one embodiment, wherein the buffer is arranged to receive the substrates to be transferred from the first main transport mechanism to the different main transport mechanism.

According to the apparatus defined in (1) above, the first main transport mechanism can place on the buffer the substrates with film formed thereon in the film forming section.

(2) The substrate treating apparatus according to one embodiment, wherein the buffer is arranged to receive the substrates placed by the first main transport mechanism.

According to the embodiment defined in (2) above, the first main transport mechanism can place on the buffer the substrates with film formed thereon in the film forming section.

(3) The substrate treating apparatus according to one embodiment, wherein the buffer is disposed between the first main transport mechanism and the different main transport mechanism.

According to the embodiment defined in (3) above, the first main transport mechanism and the different main transport mechanism can transfer the substrates conveniently.

(4) The substrate treating apparatus according to one embodiment, wherein the buffer is juxtaposed with the receiver.

According to the embodiment defined in (4) above, the first main transport mechanism can easily access both the receiver and the buffer.

(5) The substrate treating apparatus according to one embodiment, wherein the coating units include resist film coating units for applying a resist film material.

According to the embodiment defined in (5) above, resist film can be formed on the substrates with high quality.

(6) An embodiment of a substrate treating apparatus according to (5) above, wherein the coating units include anti-reflection film coating units for applying a treating solution for anti-reflection film.

According to the embodiment defined in (6) above, anti-reflection film can be formed on the substrates with high quality.

(7) The substrate treating apparatus according to one embodiment, further comprising a second detector for detecting the substrates placed on the buffer; wherein the controller is arranged to determine from a result of detection by the second detector that one of the substrates is present on the buffer.

According to the embodiment defined in (7) above, with the second detector provided, the controller can reliably determine whether or not a substrate is present on the buffer.

(8) The substrate treating apparatus according to one embodiment, further comprising an anti-reflection film coating block disposed adjacent the resist film coating block, and including anti-reflection film coating units for applying a treating solution for anti-reflection film to the substrates, heat-treating units for heat-treating the substrates, and a third main transport mechanism for transporting the substrates to and from the anti-reflection film coating units and the heat-treating units; wherein the third main transport mechanism and the first main transport mechanism transfer the substrates through a third receiver arranged to receive the substrates, and the third main transport mechanism is arranged, when unable to place the substrates on the third receiver, to place the substrates temporarily on a third buffer.

According to the embodiment defined in (8) above, in the anti-reflection film coating block the third main transport mechanism transports the substrates to and from the anti-reflection film coating units and the heat-treating units, and each treating unit carries out a predetermined treatment of the substrates. As a result, anti-reflection film is formed on the substrates. The third main transport mechanism transfers the substrates with anti-reflection film formed thereon to the first main transport mechanism of the resist film coating block.

The third main transport mechanism and first main transport mechanism transfer the substrates between the transport mechanisms through the third receiver. When a substrate cannot be placed on the third receiver, the third main transport mechanism places the substrate temporarily on the third buffer. Thus, a series of treatments in the anti-reflection film coating block including coating treatment and heat treatment can be carried out for the substrates on time. This can prevent lowering of the quality of treatment for forming anti-reflection film on the substrates.

(9) An embodiment of the substrate treating apparatus according to (8) above, wherein the third buffer is disposed adjacent and above or below the third receiver.

According to the embodiment defined in (9) above, the third main transport mechanism can selectively access both the receiver and buffer only by moving vertically.

(10) An embodiment of a substrate treating apparatus comprising resist film coating units for applying a resist film material to substrates, heat-treating units for heat-treating the substrates, a first main transport mechanism for transporting the substrates to and from the resist film coating units and the heat-treating units, a developing section for developing the substrates, a second main transport mechanism for transporting the substrates to and from the developing section, and transferring the substrates to and from the first main transport mechanism; and a buffer for temporarily holding the substrates, the buffer being disposed adjacent a receiver used for transferring the substrates from the first main transport mechanism to the second main transport mechanism.

According to the embodiment defined in (10) above, since the buffer is provided adjacent to the receiver, even when the first main transport mechanism cannot place a substrate on the receiver, the first main transport mechanism can place that substrate on the buffer. Thus, the first main transport mechanism can continue transporting substrates. That is, other substrates can be transported to the coating units and heat-treating units without delay. A series of treatments in these coating units and heat-treating units is carried out for the substrates on time. This can prevent lowering of the quality of treatment to form film on the substrates.

(11) An embodiment of the substrate treating apparatus according to (10) above, wherein the first main transport mechanism is arranged to place the substrates temporarily on the buffer at an abnormal time when the first main transport mechanism cannot place the substrates on the receiver.

According to the embodiment defined in (11) above, even at an abnormal time, the treatments in the coating units and heat-treating units can be carried out for the substrates on time (as scheduled).

(12) The substrate treating embodiment according to (10) or (11) above, wherein the buffer is arranged to hold a substrate to be accessible to the second main transport mechanism, the second main transport mechanism being permitted to receive the substrate placed on the buffer.

According to the embodiment defined in (12) above, high transporting efficiency is assured since this arrangement does not require the first main transport mechanism to transport the substrates from the buffer to the receiver in order to transfer the substrates placed on the buffer to the second main transport mechanism.

(13) The substrate treating embodiment according to any one of (10) to (12) above, wherein the second main transport mechanism is permitted to place the substrates on the receiver in order to transfer the substrates to the first main transport mechanism, and also permitted to place the substrates temporarily on the buffer.

According to the embodiment defined in (13) above, the substrates can also be transferred from the second main transport mechanism to the first main transport mechanism through the receiver, and in addition the second main transport mechanism also can place the substrates temporarily on the buffer. Even when the second main transport mechanism cannot place a substrate on the receiver, the second main transport mechanism can start transferring other substrates promptly by placing the above substrate on the buffer. Thus, there is no possibility of lowering the quality of treatment of the substrates in the developing section.

(14) The substrate treating embodiment according to (13) above, wherein the second transport mechanism is arranged to place the substrates temporarily on the buffer at an abnormal time when the second main transport mechanism cannot place the substrates on the receiver.

According to the embodiment defined in (14) above, the second transport mechanism places a substrate temporarily on the buffer when the second main transport mechanism cannot place the substrate on the receiver. Thus, the second transport mechanism can transfer other substrates without delay.

(15) The substrate treating embodiment according to any one of (10) to (14) above, wherein the buffer is arranged to accommodate the substrates corresponding in number at least to the number of coating units.

According to the embodiment defined in (15) above, at whatever time it may become impossible to place the substrates on the receiver, all the substrates being treated in the coating units at that time can receive a series of treatments on time.

(16) The substrate treating embodiment according to (15) above, wherein the buffer is arranged to accommodate the substrates corresponding in number at least to a total of the number of coating units and the number of substrates that can be treated simultaneously in the developing section.

According to the embodiment defined in (16) above, at whatever time it may become impossible to place the substrates on the receiver, all the substrates being treated in the developing section at that time can receive a series of treatments on time.

BRIEF DESCRIPTION OF THE DRAWINGS

For the purpose of illustrating the invention, there are shown in the drawings several forms, it being understood, however, that the invention is not limited to the precise arrangement and instrumentalities shown.

FIG. 7 is a view in vertical section taken on line d-d of FIG. 1;

FIG. 9 is a perspective view of a main transport mechanism;

DETAILED DESCRIPTION OF THE INVENTION

One embodiment of this invention will be described in detail hereinafter with reference to the drawings.

Figure 1:
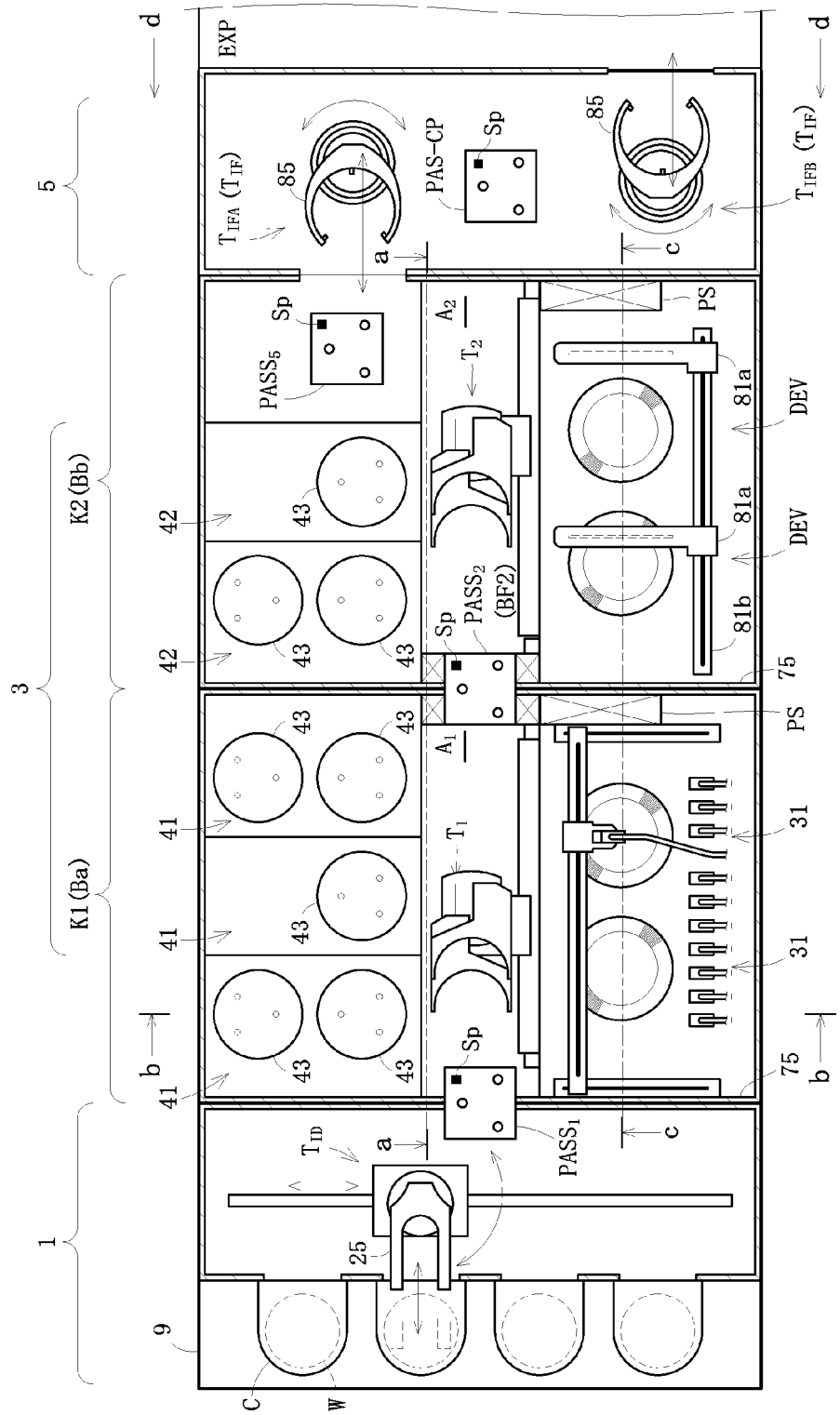
FIG. 1 is a plan view showing an outline of the substrate treating apparatus according to this invention.
Figure 2:
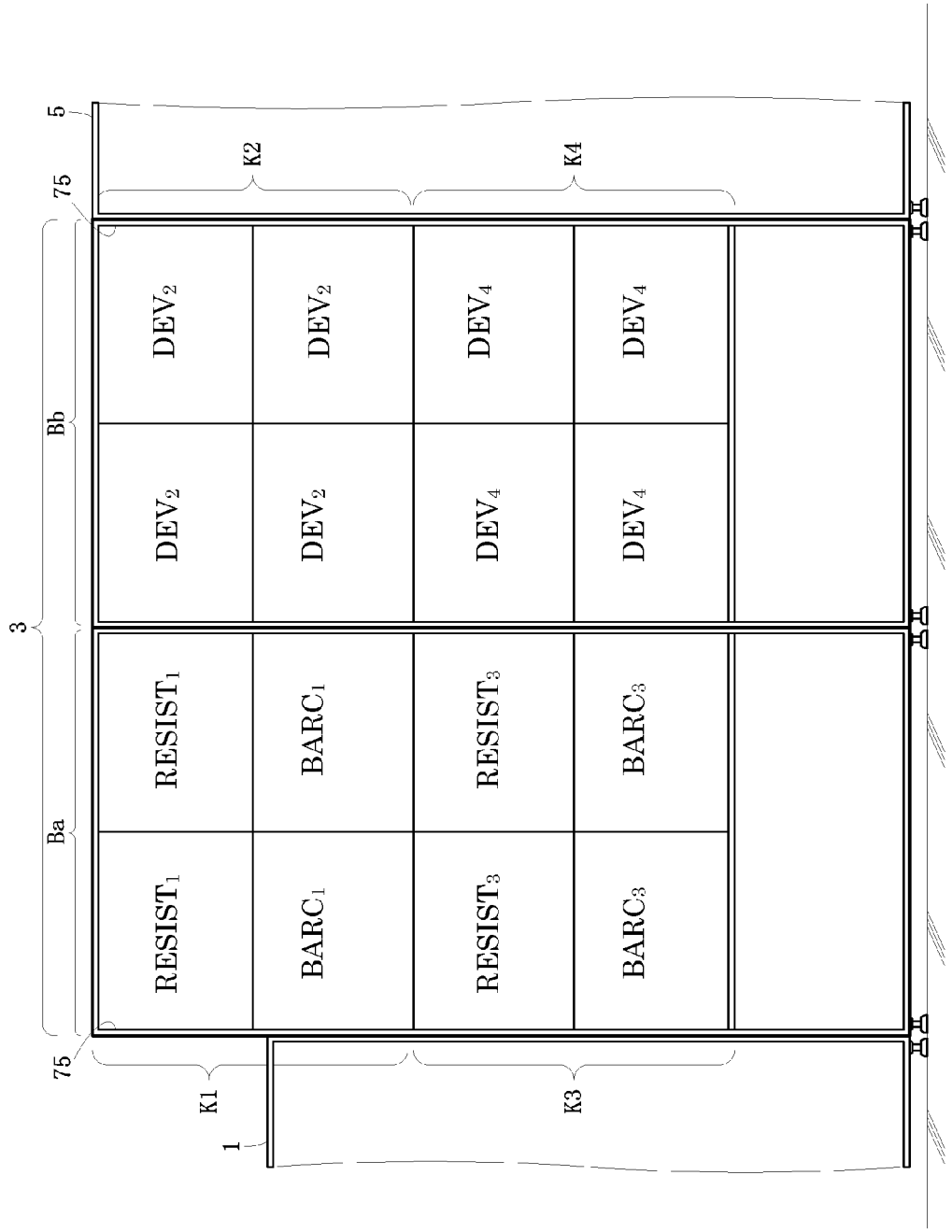
FIG. 2 is a schematic side view showing an arrangement of treating units included in the substrate treating apparatus.
Figure 3:
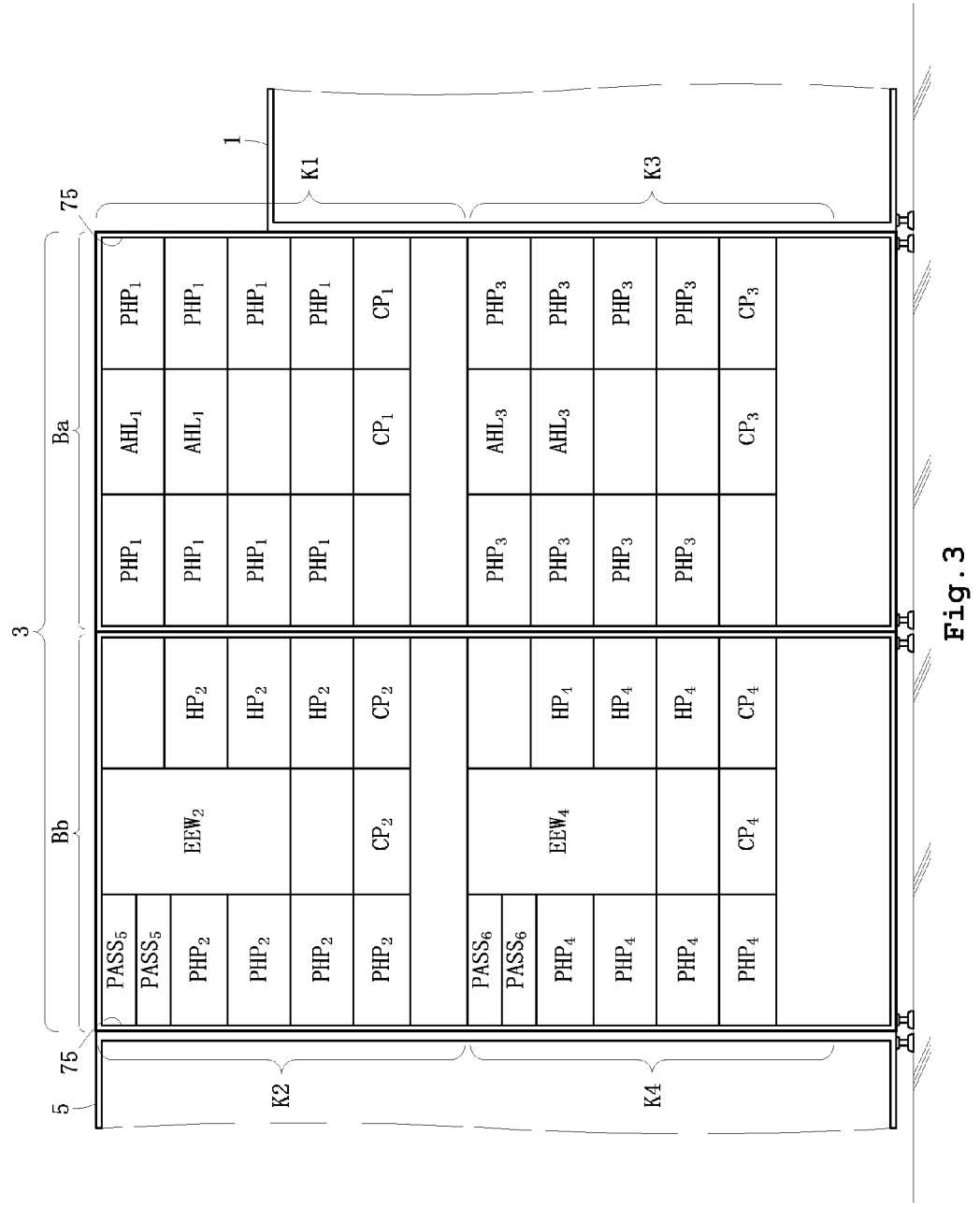
FIG. 3 is a schematic side view showing an arrangement of treating units included in the substrate treating apparatus.

FIG. 1 is a plan view showing an outline of a substrate treating apparatus according to this embodiment. FIGS. 2 and 3 are schematic side views showing an arrangement of treating units included in the substrate treating apparatus. FIGS. 4 through 7 are views in vertical section taken on lines a-a, b-b, c-c and d-d of FIG. 1, respectively.

This embodiment provides a substrate treating apparatus for forming resist film or the like on substrates (e.g. semiconductor wafers) W, and developing exposed wafers W. This apparatus is divided into an indexer section (hereinafter called "ID section") 1, a treating section 3 and an interface section (hereinafter called "IF section") 5. The ID section 1, treating section 3 and IF section 5 are arranged adjacent one another in the stated order. An exposing machine EXP, which is an external apparatus separate from this apparatus, is disposed adjacent the IF section 5.

The ID section 1 takes wafers W out of each cassette C, which stores a plurality of wafers W, and deposits wafers W in the cassette C. The ID section 1 has a cassette table 9 for receiving cassettes C, and an ID transport mechanism $T_{ID}$ for transporting wafers W to and from each cassette C.

The treating section 3 carries out treatment for forming film on the wafers W and treatment for developing the wafers W. The treating section 3 has a layered structure with a plurality of stories. In this embodiment, the treating section 3 is divided into two, upper and lower, stories. The upper and lower stories have substantially the same structure as described hereinafter. Each story includes a substrate treatment line for treating wafers W while transporting the wafers W between the ID section 1 and IF section 5. The treatment carried out on each story includes treatment for forming film on the wafers W and treatment for developing the wafers W. FIG. 1 shows the upper story.

The treating section 3 has coating units 31 and heat-treating units 41 arranged on each story. The coating units 31 apply a treating solution to the wafers W. The heat-treating units 41 heat-treat the wafers W. The coating units 31 and heat-treating units 41 constitute a film forming section for forming film on the wafers W. The treating section 3 has also developing units DEV for supplying a developer to the wafers W, and heat-treating units 42 for heat-treating the wafers W (to be described hereinafter).

The treating section 3 includes four main transport mechanisms $T_1$, $T_2$, $T_3$ and $T_4$. The main transport mechanisms $T_1$ and $T_2$ are arranged on the upper story, while the main transport mechanisms $T_3$ and $T_4$ are arranged on the lower story. Each of the main transport mechanisms $T_1$ and $T_2$ transports wafers W to and from the coating units 31 and heat-treating units 41. Each of the main transport mechanisms $T_3$ and $T_4$ transports wafers W to and from the developing units DEV and so on. Further, the main transport mechanisms $T_1$ and $T_2$ transfer wafers W between the transport mechanisms. Similarly, the main transport mechanisms $T_3$ and $T_4$ transfer wafers W between the transport mechanisms. Each of the main transport mechanisms $T_1$ and $T_3$ transfers wafers W to and from the ID transport mechanism $T_{ID}$.

The IF section 5 transports wafers W to and from the exposing machine EXP provided separately from the apparatus. The IF section 5 has IF transport mechanisms $T_{IF}$ for transporting wafers W. The IF transport mechanisms $T_{IF}$ include an IF first transport mechanism $T_{IFA}$ and an IF second transport mechanism $T_{IFB}$. The IF transport mechanisms $T_{IF}$ (first transport mechanism $T_{IFA}$ and second transport mechanism $T_{IFB}$) correspond to the interface transport mechanisms in this embodiment.

The construction of each component of this embodiment will be described in greater detail hereinafter.

[ID Section 1]

The ID section 1 takes wafers W out of each cassette C, which stores a plurality of wafers W, and deposits wafers W in the cassette C. The ID section 1 has a cassette table 9 for receiving cassettes C. The cassette table 9 can receive four cassettes C as arranged in a row. The ID section 1 has also an ID transport mechanism $T_{ID}$. The ID transport mechanism $T_{ID}$ transports wafers W to and from each cassette C, and transports wafers W to and from receivers $PASS_1$ and $PASS_3$ to be described hereinafter. The ID transport mechanism $T_{ID}$ has a movable base 21 for moving horizontally alongside the cassette table 9 in the direction of arrangement of the cassettes C, a lift shaft 23 vertically extendible and contractible relative to the movable base 21, and a holding arm 25 swivelable on the lift shaft 23, and extendible and retractable radially of the swivel motion, for holding a wafer W. The ID transport mechanism $T_{ID}$ corresponds to the indexer transport mechanism in this invention.

[Treating Section 3]

In this embodiment, the treating section 3 includes a plurality of (two) treating blocks Ba and Bb arranged side by side (in substantially the same direction as the transport direction). Each of the treating blocks Ba and Bb is vertically divided into two stories K. The upper story K1 of the treating block Ba and the upper story K2 of the treating block Bb constitute the upper story of the treating section 3 noted hereinbefore. Similarly, the lower story K3 of the treating block Ba and the lower story K4 of the treating block Bb constitute the lower story of the treating section 3. The above main transport mechanism $T_1$ and various treating units corresponding thereto are arranged on the upper story K1 of the treating block Ba, while the main transport mechanism $T_3$ and various treating units corresponding thereto are arranged on the lower story K3. Similarly, the main transport mechanism $T_2$ and various treating units corresponding thereto are arranged on the upper story K2 of the treating block Bb, while the main transport mechanism $T_4$ and various treating units corresponding thereto are arranged on the lower story K4.

[Treating Section 3—Treating Block Ba]

The treating block Ba is disposed adjacent the ID section 1. Receivers $PASS_1$ and $PASS_3$ for receiving wafers W are provided between the ID section 1 and the respective stories K1 and K3 of the treating block Ba. The receiver $PASS_1$ receives, as placed thereon, wafers W passed between the ID transport mechanism $T_{ID}$ and the main transport mechanism $T_1$. Similarly, the receiver $PASS_3$ receives, as placed thereon, wafers W passed between the ID transport mechanism $T_{ID}$ and the main transport mechanism $T_3$. Seen in a sectional view, the receiver $PASS_1$ is disposed at a height adjacent to a lower part of the upper story K2, while the receiver $PASS_3$ is disposed at a height adjacent to an upper part of the lower story K3. Thus, the positions of receiver $PASS_1$ and receiver $PASS_3$ are relatively close to each other for allowing the ID transport mechanism $T_{ID}$ to move between the receiver $PASS_1$ and receiver $PASS_3$ through using only a small amount of vertical movement.

Receivers $PASS_2$ and $PASS_4$ for receiving wafers W are provided for the respective stories K between the treating blocks Ba and Bb. Specifically, the receiver $PASS_2$ is disposed between the story K1 and story K2, and the receiver $PASS_4$ between the story K3 and story K4. The main transport mechanisms $T_1$ and $T_2$ transfer wafers W through the receiver $PASS_2$, and the main transport mechanisms $T_3$ and $T_4$ through the receiver $PASS_4$.

The receiver $PASS_1$ includes a plurality of receivers (two in this embodiment). These receivers $PASS_1$ are arranged vertically adjacent to each other. Similarly, each of the receivers $PASS_2$-$PASS_4$, and each of receivers $PASS_5$ and $PASS_6$ to be described hereinafter, includes a plurality of receivers (two in this embodiment) arranged vertically adjacent to each other.

One of the receivers PASS constituting each pair of receivers $PASS_1$-$PASS_6$ is selected according to a direction for transferring wafers W.

The receiver $PASS_1$, for example, has two receivers $PASS_{1A}$ and $PASS_{1B}$ arranged vertically adjacent to each other. One of these receivers $PASS_{1A}$ receives wafers W passed from the ID transport mechanism $T_{ID}$ to the main transport mechanism $T_1$. The other receiver $PASS_{1B}$ receives wafers W passed from the main transport mechanism $T_1$ to the ID transport mechanism $T_{ID}$.

The receiver $PASS_2$, for example, has two receivers $PASS_{2A}$ and $PASS_{2B}$ arranged vertically adjacent to each other. One of these receivers $PASS_{2A}$ receives wafers W passed from the main transport mechanism $T_1$ to the main transport mechanism $T_2$. The other receiver $PASS_{2B}$ receives wafers W passed from the main transport mechanism $T_2$ to the main transport mechanism $T_1$. In this case, the wafers W placed on one of the receivers $PASS_{2A}$ are wafers W having film formed in the film forming section (coating units 31 and heat-treating units 41) on the story K1. The wafers W placed on the other receiver $PASS_{2B}$ are wafers W developed in the developing units DEV on the story K2. This is the case also with the receiver $PASS_4$.

Each of the receivers $PASS_1$-$PASS_6$ has a plurality of support pins projecting therefrom, for receiving a wafer W in a substantially horizontal position on these support pins. Each of the receivers $PASS_1$-$PASS_6$ has also a sensor Sp for detecting presence or absence of a wafer W. Detecting signals of each sensor Sp are inputted to a control section 90 described hereinafter. Based on the detection signals of each sensor Sp, the control section 90 determines whether or not a wafer W is placed on the receiver PASS, and controls the transport mechanisms in transferring wafers W through the receiver PASS. The receiver $PASS_2$ and receiver $PASS_4$ correspond to the first receiver in this invention. The sensors Sp for detecting wafers W placed on the receivers $PASS_2$ and $PASS_4$ correspond to the first detector in this invention.

Further, buffers BF2 and BF4 are provided for the respective receivers $PASS_2$ and $PASS_4$ between the treating blocks Ba and Bb. The buffers BF2 and BF4 are used to hold wafers W temporarily. In this embodiment, when a wafer W cannot be placed on each receiver PASS, the wafer W is placed on the corresponding buffer BF temporarily. That is, usually or during a normal operation, the wafers W are placed only on the receivers PASS, and the wafers W are not placed on the buffers BF.

The buffers BF2 and BF4 are arranged adjacent the receivers $PASS_2$ and $PASS_4$, respectively. In this embodiment, the buffer BF2 is stacked under the receiver $PASS_2$, and the buffer BF4 under the receiver $PASS_4$.

The number of wafers W that can be accommodated in each of the buffers BF2 and BF4, preferably, is equal to or larger than the number of coating units 31 provided on each story K1 or K3. Where, for example, the story K1 has two resist film coating units $RESIST_1$ and two anti-reflection film coating units $BARC_1$, the buffer BF2 can accommodate at least four wafers W which corresponds to the total number of coating units. More preferably, the number of wafers W that can be accommodated in each of the buffers BF2 and BF4 is equal to or larger than the number of wafers W that can be treated simultaneously in the film forming section on the story K1 or K3.

Figure 4:
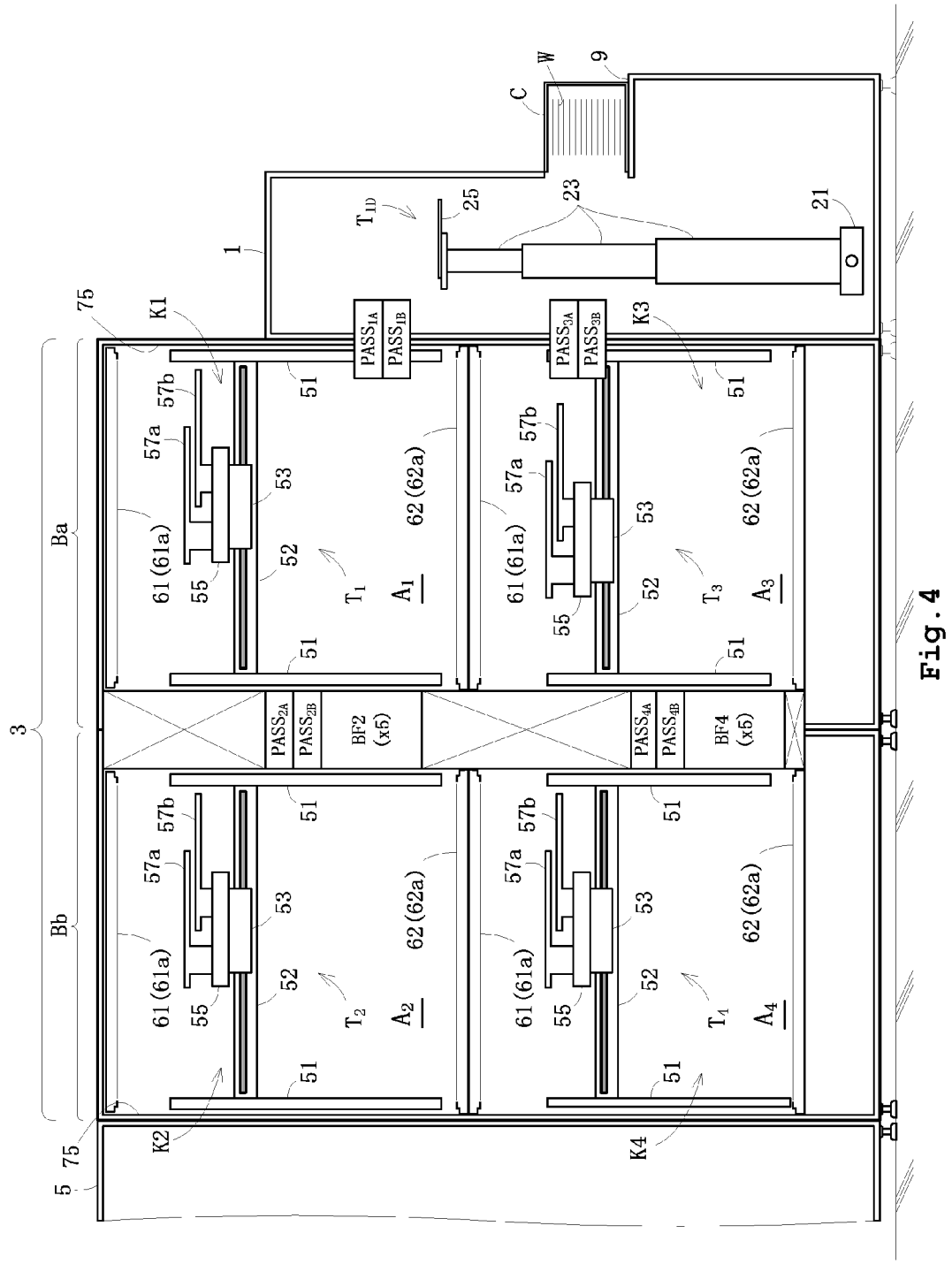
FIG. 4 is a view in vertical section taken on line a-a of FIG. 1.

In this embodiment, as shown in FIG. 4, each of the buffers BF2 and BF4 can accommodate five wafers W.

Each of the buffers BF2 and BF4 has shelves for storing wafers W in multiple stages, and is open at opposite ends facing the main transport mechanism $T_1$ and main transport mechanism $T_2$. Thus, both of the main transport mechanism $T_1$ and main transport mechanism $T_2$ can deposit wafers W on the shelves, and fetch wafers W from the shelves. The buffers BF2 and BF4 are not limited to the above construction. As long as they can receive wafers W temporarily, the buffers BF2 and BF4 may hold wafers W in any positions, e.g. peripheral positions or at the lower surfaces. For example, each buffer BF may have a plurality of projecting support pins like the receivers PASS, for supporting wafers W in a substantially horizontal position.

Each of the buffers BF2 and BF4, and buffers BFIF described hereinafter, has a sensor (not shown) for detecting presence or absence of wafers W placed thereon. Detection signals of each sensor is inputted to the control section 90 described hereinafter. Based on the detection signals of each sensor, the control section 90 determines whether or not wafers W are placed on the buffer BF, and controls substrate transport of the corresponding transport mechanisms. Each of the buffers BF2 and BF4 corresponds to the first buffer in this invention. Each sensor for detecting wafers W placed on the buffer BF2 or BF4 corresponds to the second detector in this invention.

The story K1 will now be described. The main transport mechanism $T_1$ is movable in a transporting space $A_1$ extending substantially through the center of the story K1 and parallel to the direction of transport. The treating units on the story K1 are divided broadly into coating units 31 for applying a treating solution to wafers W, and heat-treating units 41 for heat-treating the wafers W. The coating units 31 are arranged on one side of the transporting space $A_1$, while the heat-treating units 41 are arranged on the other side thereof. The coating units 31 and heat-treating units 41 constitute the film forming section noted hereinbefore.

The coating units 31 are arranged vertically and horizontally, each facing the transporting space $A_1$. In this embodiment, four coating units 31 in total are arranged in two columns and two rows.

The coating units 31 include anti-reflection film coating units BARC for forming anti-reflection film on the wafers W, and resist film coating units RESIST for forming resist film on the wafers W (i.e. carrying out resist film forming treatment).

The anti-reflection film coating units BARC apply a treating solution for anti-reflection film to the wafers W. The resist film coating units RESIST apply a resist film material to the wafers W. The plurality of (two) anti-reflection film coating units BARC are arranged at substantially the same height in the lower row. The plurality of resist film coating units RESIST are arranged at substantially the same height in the upper row. No dividing wall or partition is provided between the anti-reflection film coating units BARC. That is, all the anti-reflection film coating units BARC are only housed in a common chamber, and the atmosphere around each anti-reflection film coating unit BARC is not blocked off (i.e. is in communication). Similarly, the atmosphere around each resist film coating unit RESIST is not blocked off.

Figure 8A:
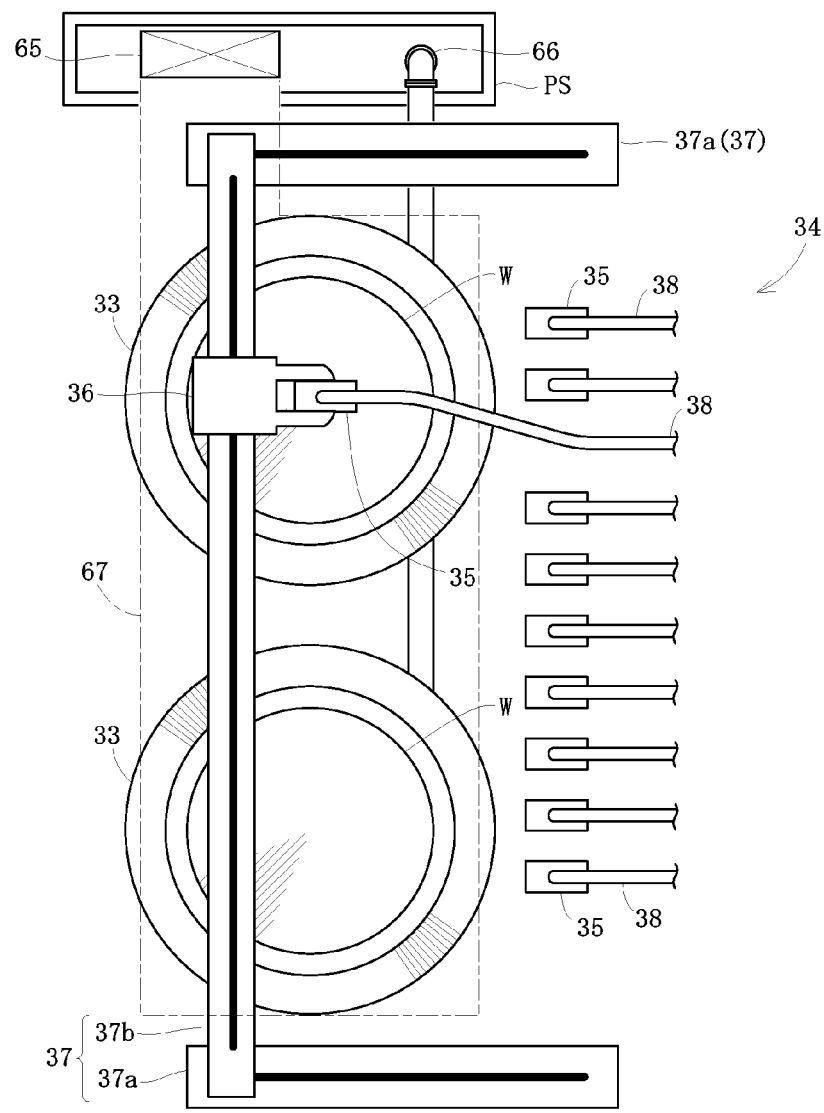
FIG. 8A is a plan view of coating units.
Figure 8B:
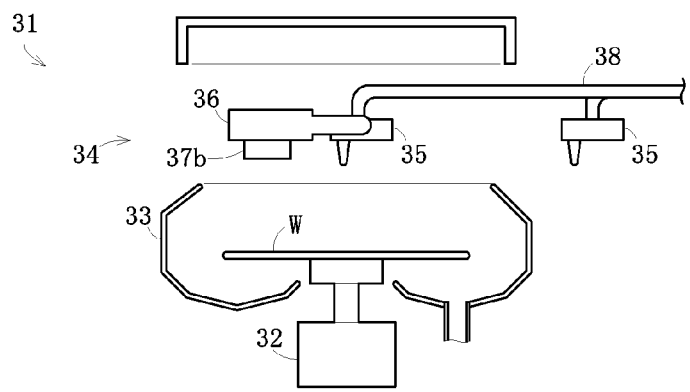
FIG. 8B is a sectional view of a coating unit.

Reference is made to FIGS. 8A and 8B. FIG. 8A is a plan view of the coating units 31. FIG. 8B is a sectional view of a coating unit 31. Each coating unit 31 includes a spin holder 32 for holding and spinning a wafer W, a cup 33 surrounding the wafer W, and a supply device 34 for supplying a treating solution to the wafer W.

The supply device 34 includes a plurality of nozzles 35, a gripper 36 for gripping one of the nozzles 35, and a nozzle moving mechanism 37 for moving the gripper 36 to move one of the nozzles 35 between a treating position above the wafer W and a standby position away from above the wafer W. Each nozzle 35 has one end of a treating solution pipe 38 connected thereto. The treating solution pipe 38 is arranged movable (flexible) to permit movement of the nozzle 35 between the standby position and treating position. The other end of each treating solution pipe 38 is connected to a treating solution source (not shown). Specifically, in the case of anti-reflection film coating units BARC, the treating solution sources supply different types of treating solution for anti-reflection film to the respective nozzles 35. In the case of resist film coating units RESIST, the treating solution sources supply different types of resist film material to the respective nozzles 35.

The nozzle moving mechanism 37 has first guide rails 37a and a second guide rail 37b. The first guide rails 37a are arranged parallel to each other and opposed to each other across the two cups 33 arranged sideways. The second guide rail 37b is slidably supported by the two first guide rails 37a and disposed above the two cups 33. The gripper 36 is slidably supported by the second guide rail 37b. The first guide rails 37a and second guide rail 37b take guiding action substantially horizontally and in directions substantially perpendicular to each other. The nozzle moving mechanism 37 further includes drive members (not shown) for sliding the second guide rail 37b, and sliding the gripper 36. The drive members are operable to move the nozzle 35 gripped by the gripper 36 to the treating positions above the two spin holders 32.

Figure 5:
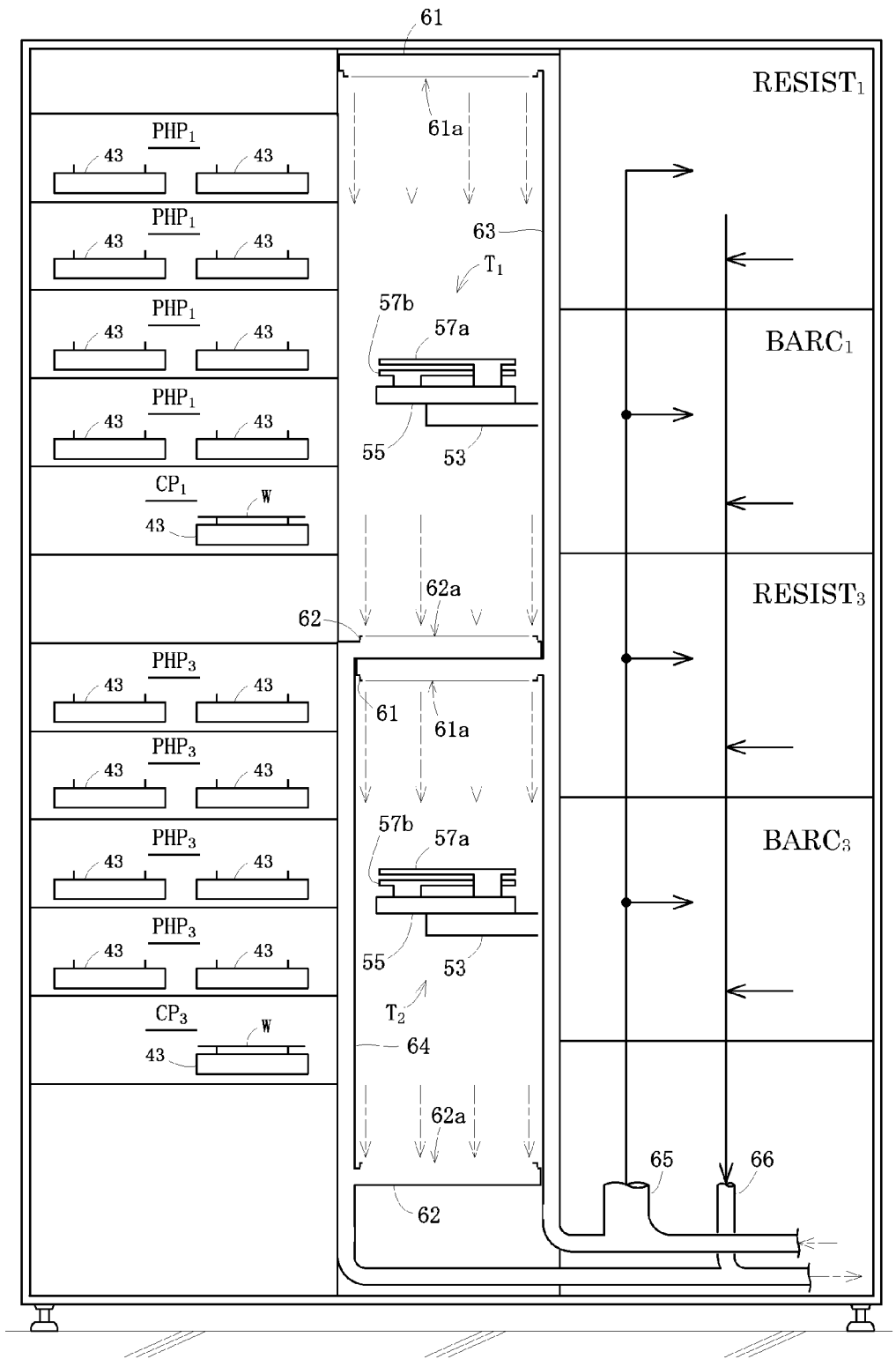
FIG. 5 is a view in vertical section taken on line b-b of FIG. 1.

The plurality of heat-treating units 41 are arranged vertically and horizontally, each facing the transporting space $A_1$. In this embodiment, three heat-treating units 41 can be arranged horizontally, and five heat-treating units 41 can be stacked vertically. Each heat-treating unit 41 has a plate 43 for receiving a wafer W. The heat-treating units 41 include cooling units CP for cooling wafers W, heating and cooling units PHP for carrying out heating and cooling treatments continually, and adhesion units AHL for heat-treating wafers W in an atmosphere of hexamethyldisilazane (HMDS) vapor in order to promote adhesion of coating film to the wafers W. As shown in FIG. 5, each heating and cooling unit PHP has two plates 43, and a local transport mechanism (not shown) for moving a wafer W between the two plates 43. The various types of heat-treating units CP, PHP and AHL are arranged in appropriate positions.

The main transport mechanism $T_1$ will be described specifically. Reference is made to FIG. 9. FIG. 9 is a perspective view of the main transport mechanism $T_1$. The main transport mechanism $T_1$ has two third guide rails 51 for providing vertical guidance, and a fourth guide rail 52 for providing horizontal guidance. The third guide rails 51 are fixed opposite each other at one side of the transporting space $A_1$. In this embodiment, the third guide rails 51 are arranged at the side adjacent the coating units 31. The fourth guide rail 52 is slidably attached to the third guide rails 51. The fourth guide rail 52 has a base 53 slidably attached thereto. The base 53 extends transversely, substantially to the center of the transporting space $A_1$. Further, drive members (not shown) are provided for vertically moving the fourth guide rail 52, and horizontally moving the base 53. The drive members are operable to move the base 53 to positions for accessing the coating units 31 and heat-treating units 41 arranged vertically and horizontally.

The base 53 has a turntable 55 rotatable about a vertical axis Q. The turntable 55 has two holding arms 57a and 57b horizontally movably attached thereto for holding wafers W, respectively. The two holding arms 57a and 57b are arranged vertically close to each other. Further, drive members (not shown) are provided for rotating the turntable 55, and moving the holding arms 57a and 57b. The drive members are operable to move the turntable 55 to positions opposed to the coating units 31, heat-treating units 41, receivers $PASS_1$ and $PASS_2$ and buffer BF2, and to extend and retract the holding arms 57a and 57b to and from the coating units 31 and so on.

The story K3 will be described next. Like reference numerals are used to identify like parts which are the same as in the story K1, and will not be described again. The layout (arrangement) in plan view of the main transport mechanism $T_3$ and various treating units on the story K3 is substantially the same as on the story K1. Thus, the arrangement of the various treating units of the story K3 as seen from the main transport mechanism $T_3$ is substantially the same as the arrangement of the various treating units of the story K1 as seen from the main transport mechanism $T_1$. The coating units 31 and heat-treating units 41 of the story K3 are stacked under the coating units 31 and heat-treating units 41 of the story K1, respectively.

In the following description, when distinguishing the resist film coating units RESIST in the stories K1 and K3, subscripts "1" and "3" will be affixed (for example, the resist film coating units RESIST in the story K1 will be referred to as "resist film coating units $RESIST_1$").

Figure 6:
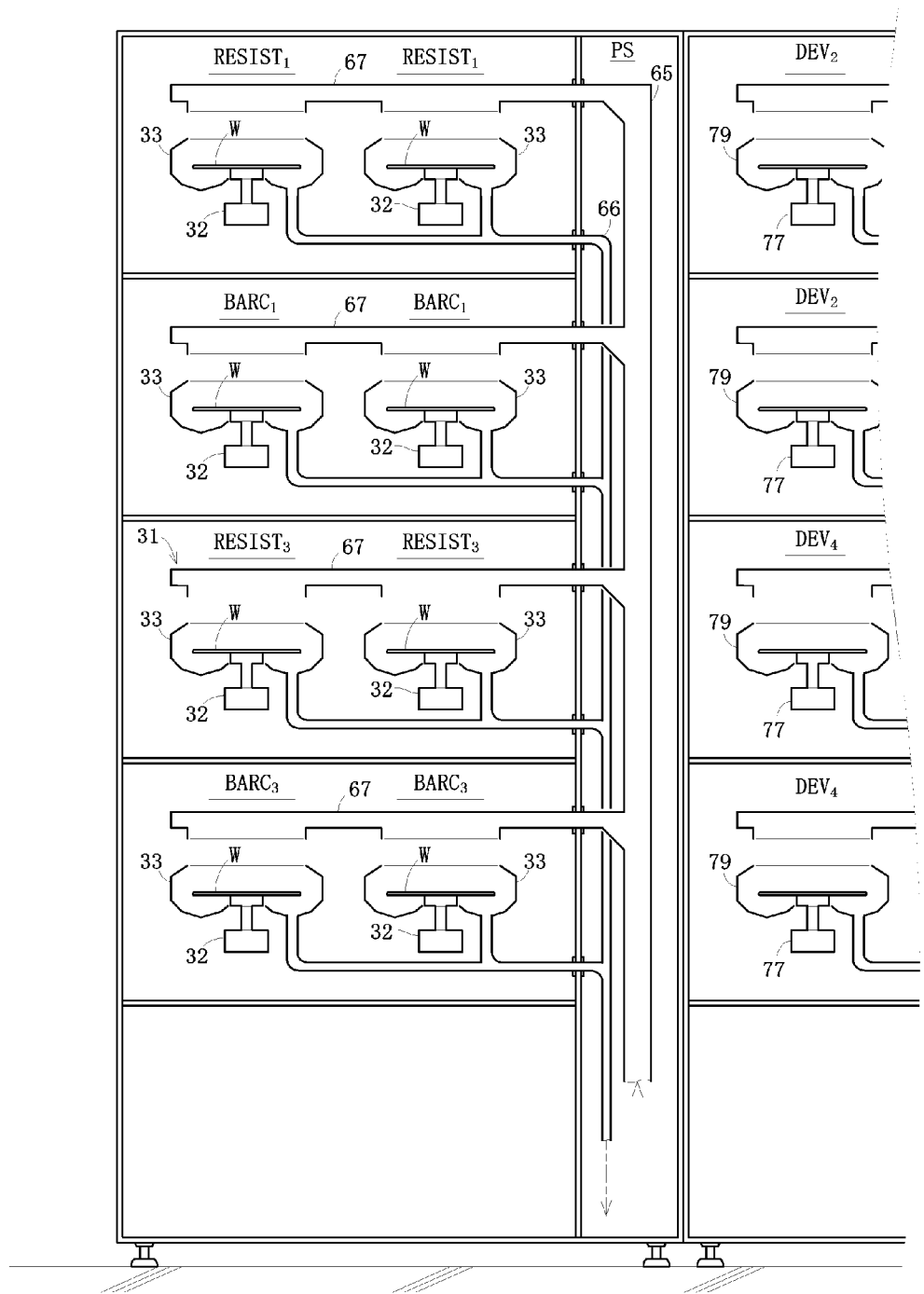
FIG. 6 is a view in vertical section taken on line c-c of FIG. 1.

The other aspects of the treating block Ba will be described. As shown in FIGS. 5 and 6, each of the transporting spaces $A_1$ and $A_3$ has a first blowout unit 61 for blowing out a clean gas, and an exhaust unit 62 for sucking the gas. Each of the first blowout unit 61 and exhaust unit 62 is in the form of a flat box having substantially the same area as the transporting space $A_1$ in plan view. Each of the first blowout unit 61 and exhaust unit 62 has first blowout openings 61a or exhaust openings 62a formed in one surface thereof. In this embodiment, the first blowout openings 61a or exhaust openings 62a are in the form of numerous small bores f (see FIG. 9). The first blowout units 61 are arranged over the transporting spaces $A_1$ and $A_3$ with the first blowout openings 61a directed downward. The exhaust units 62 are arranged under the transporting spaces $A_1$ and $A_3$ with the exhaust openings 62a directed upward. The atmosphere in the transporting space $A_1$ and the atmosphere in the transporting space $A_3$ are blocked off by the exhaust unit 62 of the transporting space $A_1$ and the first blowout unit 61 of the transporting space $A_3$. Thus, each of the stories K1 and K3 has the atmosphere blocked off from the other.

Referring to FIG. 5, the first blowout units 61 of the transporting spaces $A_1$ and $A_3$ are connected to a common, first gas supply pipe 63. The first gas supply pipe 63 extends laterally of the receivers $PASS_2$ and $PASS_4$ from an upper position of the transporting space $A_1$ to a lower position of the transporting space $A_3$, and is bent below the transporting space $A_3$ to extend horizontally. The other end of the first gas supply pipe 63 is connected to a gas source not shown. Similarly, the exhaust units 62 of the transporting spaces $A_1$ and $A_3$ are connected to a common, first gas exhaust pipe 64. The first gas exhaust pipe 64 extends laterally of the receivers $PASS_2$ and $PASS_4$ from a lower position of the transporting space $A_1$ to a lower position of the transporting space $A_3$, and is bent below the transporting space $A_2$ to extend horizontally. As the gas is blown out of each first blowout opening 61a and sucked and exhausted through each exhaust opening 62a of the transporting spaces $A_1$ and $A_3$, gas currents are formed to flow from top to bottom of the transporting spaces $A_1$ and $A_3$, thereby keeping each of the transporting spaces $A_1$ and $A_3$ in a clean state.

As shown in FIGS. 1, 6 and 8A, each coating unit 31 of the stories K1 and K3 has a pit portion PS extending vertically. The pit portion PS accommodates a second gas supply pipe 65 extending vertically for supplying the clean gas, and a second gas exhaust pipe 66 extending vertically for exhausting the gas. Each of the second gas supply pipe 65 and second gas exhaust pipe 66 branches at a predetermined height in each coating unit 31 to extend substantially horizontally from the pit portion PS. A plurality of branches of the second gas supply pipe 65 are connected to second blowout units 67 for blowing out the gas downward. A plurality of branches of the second gas exhaust pipe 66 are connected for communication to the bottoms of the respective cups 33. The other end of the second gas supply pipe 65 is connected to the first gas supply pipe 63 below the story K3. The other end of the second gas exhaust pipe 66 is connected to the first gas exhaust pipe 64 below the story K3. As the gas is blown out of the second blowout units 67 and exhausted through the second exhaust pipes 62a, the atmosphere inside each cup 33 is constantly maintained clean, thereby allowing for excellent treatment of the wafer W held by the spin holder 32.

The pit portions PS further accommodate piping of the treating solutions, electric wiring and the like (not shown). Thus, with the pit portions PS accommodating the piping and electric wiring provided for the coating units 31 of the stories K1 and K3, the piping and electric wiring can be reduced in length.

The treating block Ba has one housing 75 for accommodating the main transport mechanisms $T_1$ and $T_3$, coating units 31 and heat-treating units 41 described hereinbefore. The treating block Bb described hereinafter also has a housing 75 for accommodating the main transport mechanisms $T_2$ and $T_4$ and the various treating units of the treating block Bb. The housing 75 of the treating block Ba and the housing 75 of the treating block Bb are separate entities. Thus, with each of the treating blocks Ba and Bb having the housing 75 accommodating the main transport mechanisms T and various treating units en bloc, the treating section 3 may be manufactured and assembled simply. The treating block Ba corresponds to the resist film coating block in this invention. The main transport mechanisms $T_1$ and $T_3$ correspond to the first main transport mechanism in this invention.

[Treating Section 3—Treating Block Bb]

The treating block Bb is disposed adjacent the IF section 5. The story K2 will be described. Like reference numerals are used to identify like parts which are the same as in the story K1 and will not be described again. The story K2 has a transporting space $A_2$ formed as an extension of the transporting space $A_1$.

The treating units on the story K2 are developing units DEV for developing wafers W, heat-treating units 42 for heat-treating the wafers W, and an edge exposing unit EEW for exposing peripheral regions of the wafers W. The developing units DEV are arranged at one side of the transporting space $A_2$, and the heat-treating units 42 and edge exposing unit EEW are arranged at the other side of the transporting space $A_2$. Preferably, the developing units DEV are arranged at the same side as the coating units 31. It is also preferable that the heat-treating units 42 and edge exposing unit EEW are arranged in the same row as the heat-treating units 41. The developing units DEV and heat-treating units 42 constitute a developing section for developing wafers W.

The number of developing units DEV is four, and sets of two units DEV arranged horizontally along the transporting space $A_2$ are stacked one over the other. As shown in FIGS. 1 and 6, each developing unit DEV includes a spin holder 77 for holding and spinning a wafer W, and a cup 79 surrounding the wafer W. The two developing units DEV arranged at the lower level are not separated from each other by a partition wall or the like. A supply device 81 is provided for supplying developers to the two developing units DEV. The supply device 81 includes two slit nozzles 81a having a slit or a row of small bores for delivering the developers. The slit or row of small bores, preferably, has a length corresponding to the diameter of wafer W. Preferably, the two slit nozzles 81a are arranged to deliver developers of different types or concentrations. The supply device 81 further includes a moving mechanism 81b for moving each slit nozzle 81a. Thus, the slit nozzles 81a are movable, respectively, over the two spin holders 77 juxtaposed sideways.

The plurality of heat-treating units 42 are arranged sideways along the transporting space $A_2$, and stacked one over the other. The heat-treating units 42 include heating units HP for heating wafers W, cooling units CP for cooling wafers W, and heating and cooling units PHP for successively carrying out heating treatment and cooling treatment.

The plurality of heating and cooling units PHP are vertically stacked in the column closest to the IF section 5, each having one side facing the IF section 5. The heating and cooling units PHP on the story K2 have transport ports formed in the sides thereof for passage of wafers W. IF transport mechanisms $T_{IF}$ to be described hereinafter transport wafers W through the above transport ports to the heating and cooling units PHP. The heating and cooling units PHP arranged on the story K2 carry out post-exposure baking (PEB) treatment for exposed wafers W.

The single edge exposing unit EEW is disposed in a predetermined position. The edge exposing unit EEW includes a spin holder (not shown) for holding and spinning a wafer W, and a light emitter (not shown) for exposing edges of the wafer W held by the spin holder.

The receiver $PASS_5$ is formed on top of the heating and cooling units PHP on the story K2. Through the receiver $PASS_5$, the main transport mechanism $T_2$ and IF transport mechanisms $T_{IF}$ to be described hereinafter transfer wafers W.

The main transport mechanism $T_2$ is disposed substantially centrally of the transporting space $A_2$ in plan view. The main transport mechanism $T_2$ has the same construction as the main transport mechanism $T_1$. The main transport mechanism $T_2$ transports wafers W to and from the receiver $PASS_2$, various heat-treating units 42, edge exposing unit EEW and receiver $PASS_5$.

The story K4 will be described briefly. The relationship in construction between story K2 and story K4 is similar to that between stories K1 and K3. The treating units U on the story K4 are developing units DEV, heat-treating units 42 and an edge exposing unit EEW. The heat-treating units 42 on the story K4 include heating units HP, cooling units CP and heating and cooling units PHP. The receiver $PASS_6$ is formed on top of the heating and cooling units PHP on the story K4. The main transport mechanism $T_4$ and IF transport mechanisms $T_{IF}$ described hereinafter transfer wafers W through the receiver $PASS_6$. The heating and cooling units PHP on the story K4 also correspond to the PEB units in this invention.

In the following description, when distinguishing the developing units DEV, edge exposing units EEW and so on provided on the stories K2 and K4, subscripts "2" and "4" will be affixed (for example, the heating units HP on the story K2 will be referred to as "heating units $HP_2$").

Each of the transporting spaces $A_2$ and A4 of the stories K2 and K4 also has constructions corresponding to the first blowout unit 61 and exhaust unit 62. Each developing unit DEV of the stories K2 and K4 also has constructions corresponding to the second blowout unit 67 and second gas exhaust pipe 66.

The treating block Bb corresponds to the developing block in this invention. Each of the main transport mechanism $T_2$ and main transport mechanism $T_4$ corresponds to the second main transport mechanism and to the other main transport mechanism in this invention. Each of the receiver $PASS_5$ and receiver $PASS_6$ corresponds to the second receiver in this invention.

The IF section 5 transfers wafers W between the treating section 3 (more particularly, the stories K2 and K4 of the treating block Bb) and the exposing machine EXP. The IF section 5 has IF transport mechanisms $T_{IF}$ for transporting wafers W. IF transport mechanisms $T_{IF}$ include an IF first transport mechanism $T_{IFA}$ and an IF second transport mechanism $T_{IFB}$ that can transfer wafers W to and from the transport mechanisms. IF first transport mechanism $T_{IFA}$ transports wafers W to and from the stories K2 and K4. In this embodiment, as described hereinbefore, IF first transport mechanism $T_{IFA}$ transports wafers W to and from the receivers $PASS_5$ and $PASS_6$ on the stories K2 and K4, and to and from the heating and cooling units PHP on the stories K2 and K4. IF second transport mechanism $T_{IFB}$ transports wafers W to and from the exposing machine EXP. IF transport mechanisms $T_{IF}$ correspond to the interface transport mechanisms in this invention.

As shown in FIG. 1, IF first transport mechanism $T_{IFA}$ and IF second transport mechanism $T_{IFB}$ are arranged in a transverse direction substantially perpendicular to the direction of arrangement of the main transport mechanisms T on each story. IF first transport mechanism $T_{IFA}$ is disposed at the side where the heat-treating units 42 and so on of the treating block Bb are located. IF second transport mechanism $T_{IFB}$ is disposed at the side where the developing units DEV of the treating block Bb are located.

Stacked in multiples stages between IF first and second transport mechanisms $T_{IFA}$ and $T_{IFB}$ are a receiver PASS-CP for receiving and cooling wafers W, a receiver $PASS_7$ for receiving wafers W, and buffers BFIF for temporarily storing wafers W. The buffers BFIF are divided into a send buffer $BF_{IFS}$ for temporarily storing wafers W to be sent to the exposing machine EXP, and a return buffer $BF_{IFR}$ for temporarily storing wafers W to be returned to the treating section 3. The return buffer $BF_{IFR}$ stores wafers W having received post-exposure baking (PEB) treatment. The send buffer $BF_{IFS}$ can accommodate five wafers W. The return buffer $BF_{IFR}$ can accommodate eight wafers W which corresponds in number to the total of heating and cooling units PHP which carry out the post-exposure baking (PEB) treatment.

IF first and second transport mechanisms $T_{IFA}$ and $T_{IFB}$ transfer wafers W through the receiver PASS-CP and receiver PASS. The buffers BFIF are accessed exclusively by IF first transport mechanism $T_{IFA}$. The return buffer $BF_{IFR}$ corresponds to the second buffer in this invention.

As shown in FIG. 7, IF first transport mechanism $T_{IFA}$ includes a fixed base 83, lift shafts 85 vertically extendible and contractible relative to the base 83, and a holding arm 87 swivelable on the lift shafts 85, and extendible and retractable radially of the swivel motion, for holding a wafer W. IF second transport mechanism $T_{IFB}$ also has a base 83, lift shafts 85 and a holding arm 87.

Figure 10:
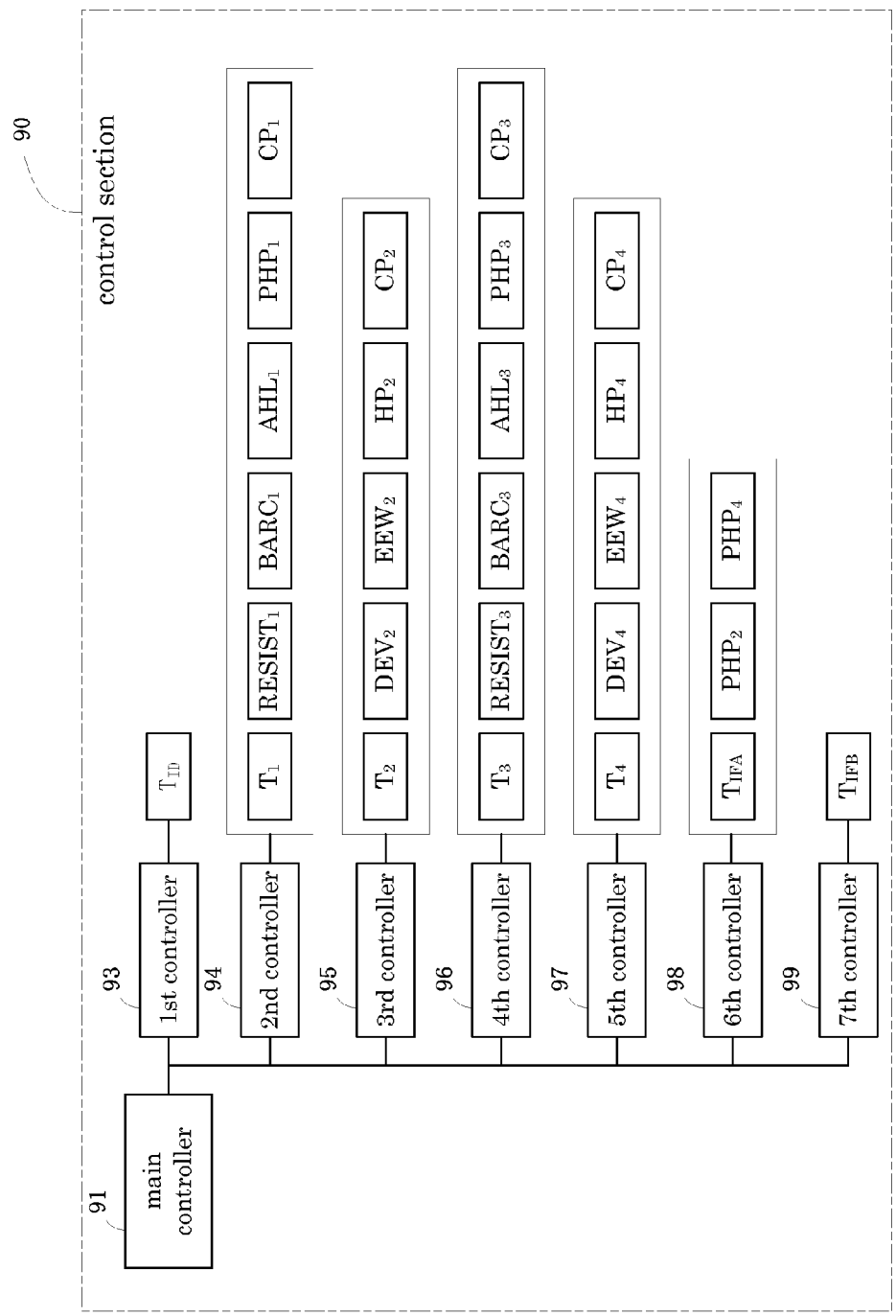
FIG. 10 is a control block diagram of the substrate treating apparatus according to the invention.

A control system of this apparatus will be described next. FIG. 10 is a control block diagram of the substrate treating apparatus according to the invention. As shown, the control section 90 of this apparatus includes a main controller 91 and first to seventh controllers 93, 94, 95, 96, 97, 98 and 99.

The main controller 91 performs overall control of the first to seventh controllers 93-99. Further, the main controller 91 can communicate through a host computer with an exposing machine controller provided for the exposing machine EXP. The first controller 93 controls substrate transport by the ID transport mechanism $T_{ID}$. The second controller 94 controls substrate transport by the main transport mechanism $T_1$, and substrate treatment in the resist film coating units $RESIST_1$, anti-reflection film coating units $BARC_1$, cooling units $CP_1$, heating and cooling units $PHP_1$ and adhesion units $AHL_1$. The third controller 95 controls substrate transport by the main transport mechanism $T_2$, and substrate treatment in the edge exposing unit $EEW_2$, developing units $DEV_2$, heating units $HP_2$ and cooling units $CP_2$. The controls by the fourth and fifth controllers 96 and 97 correspond to those by the second and third controllers 94 and 95, respectively. The sixth controller 98 controls substrate transport by IF first transport mechanism $T_{IFA}$, and substrate treatment in the heating and cooling units $PHP_2$ and $PHP_4$. The seventh controller 99 controls substrate transport by IF second transport mechanism $T_{IFB}$. The first to seventh controllers 93-99 carry out the controls independently of one another.

Each of the main controller 91 and the first to seventh controllers 93-99 is realized by a central processing unit (CPU) which performs various processes, a RAM (Random Access Memory) used as the workspace for operation processes, and a storage medium such as a fixed disk for storing a variety of information including a predetermined processing recipe (processing program).

Figure 11:
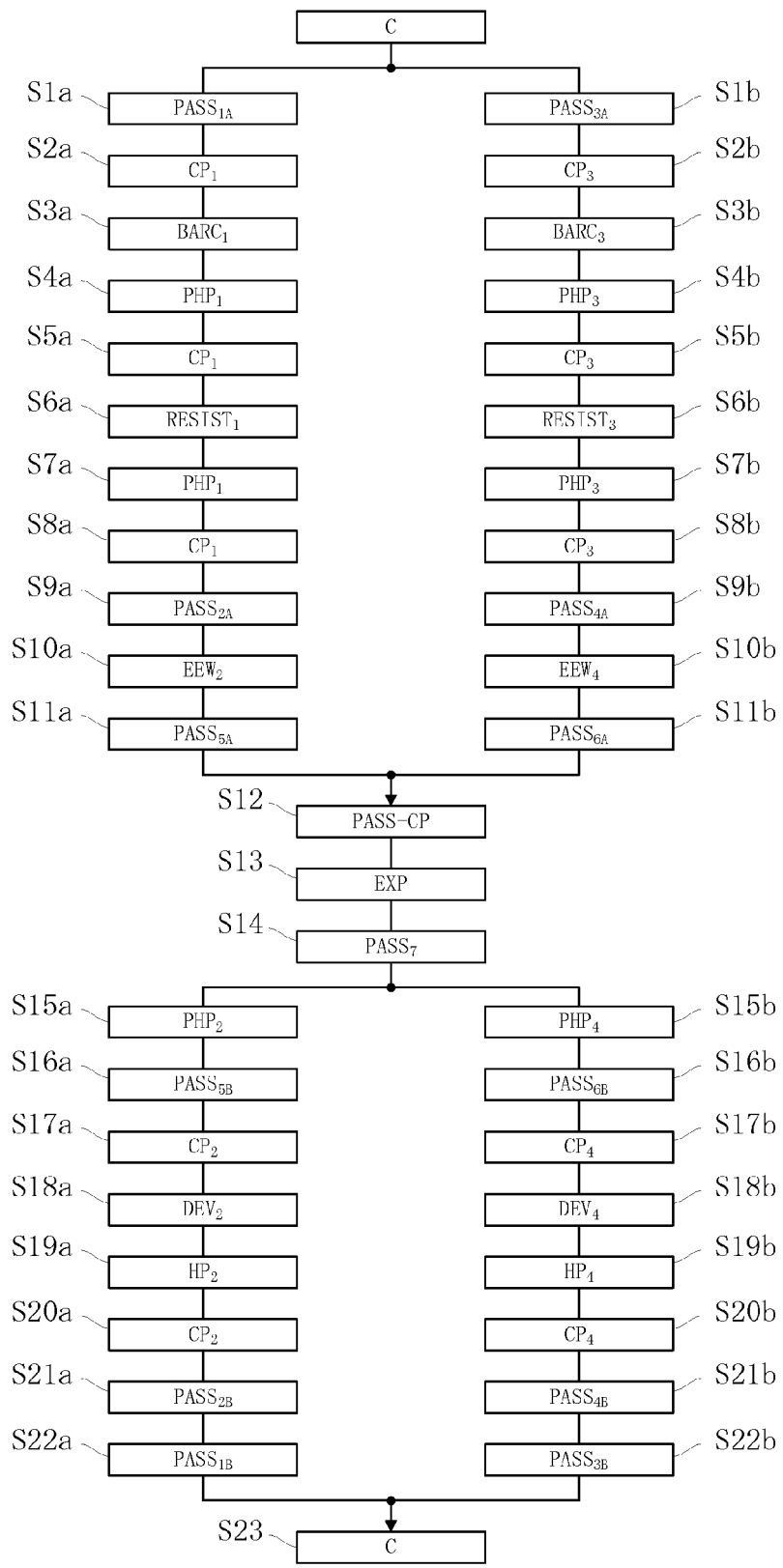
FIG. 11 is a flow chart of a series of treatments of substrates.
Figure 12:
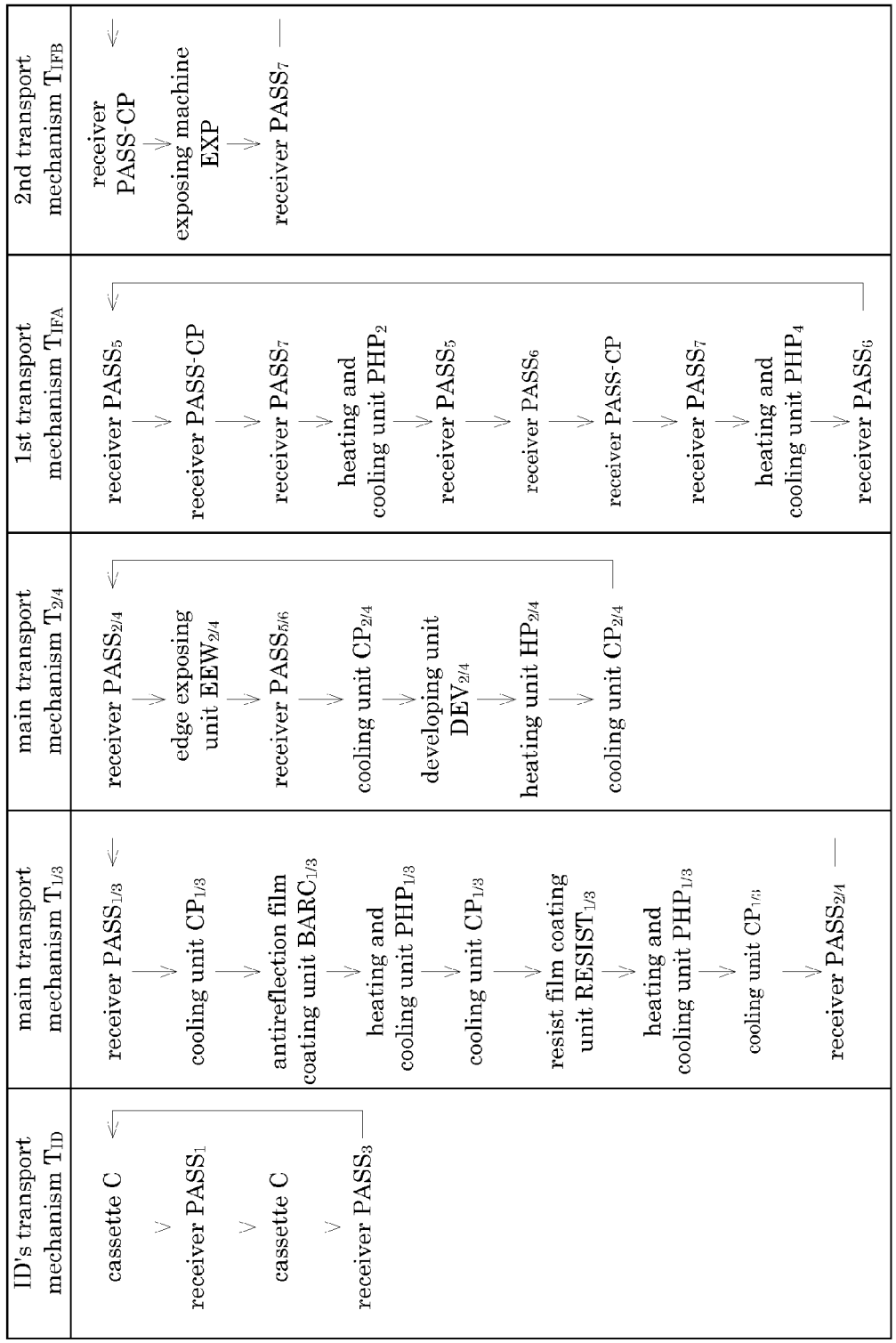
FIG. 12 is a view schematically showing operations repeated by each transport mechanism.

Next, operation of the substrate treating apparatus in this embodiment will be described. FIG. 11 is a flow chart of a series of treatments of wafers W, indicating the treating units and receivers to which the wafers W are transported in order. FIG. 12 is a view schematically showing operations repeated by each transport mechanism, and specifying an order of treating units, receivers and cassettes accessed by the transport mechanisms. FIGS. 11 and 12 show an example of ordinary operation in which the transport mechanisms can transfer wafers W through the receivers PASS. The following description will be made separately for each transport mechanism. Further, regarding the main transport mechanisms $T_1$-$T_4$ and IF transport mechanisms $T_{IF}$, an example of operation in which wafers W cannot be placed on the receivers PASS will be described in addition to the example of normal operation.

[ID Transport Mechanism $T_{ID}$]

The ID transport mechanism $T_{ID}$ moves to a position opposed to one of the cassettes C, holds with the holding arm 25 a wafer W to be treated and takes the wafer W out of the cassette C. The ID transport mechanism $T_{ID}$ swivels the holding arm 25, vertically moves the lift shaft 23, moves to a position opposed to the receiver $PASS_1$, and places the wafer W on the receiver $PASS_{1A}$ (which corresponds to step S1a in FIG. 11; only step numbers will be indicated hereinafter). At this time, a wafer W usually is present on the receiver $PASS_{1B}$, and the ID transport mechanism $T_{ID}$ receives this wafer W and stores it in a cassette C (step S23). When there is no wafer W on the receiver $PASS_{1B}$, step S23 is omitted. Then, the ID transport mechanism $T_{ID}$ accesses the cassette C, and transports a wafer W from the cassette C to the receiver $PASS_{3A}$ (step S1b). Here again, if a wafer W is present on the receiver $PASS_{3B}$, the ID transport mechanism $T_{ID}$ will store this wafer W in a cassette C (step S23). The ID transport mechanism $T_{ID}$ repeats the above operation.

This operation of the ID transport mechanism $T_{ID}$ is controlled by the first controller 93. As a result, the wafers W in the cassette C are fed to the story K1, and the wafers W delivered from the story K1 are stored in the cassette C. Similarly, the wafers W in the cassette C are fed to the story K3, and the wafers W delivered from the story K3 are stored in the cassette C.

[Main Transport Mechanisms $T_1$, $T_3$]

Since operation of the main transport mechanism $T_3$ is substantially the same as operation of the main transport mechanism $T_1$, only the main transport mechanism $T_1$ will be described. The main transport mechanism $T_1$ moves to a position opposed to the receiver $PASS_1$. At this time, the main transport mechanism $T_1$ holds, on one holding arm 57 (e.g. 57b), a wafer W received immediately before from the receiver $PASS_{2B}$. The main transport mechanism $T_1$ places this wafer W on the receiver $PASS_{1B}$ (step S22), and holds the wafer W present on the receiver $PASS_{1A}$ with the other holding arm 57 (e.g. 57a).

The main transport mechanism $T_1$ accesses a predetermined one of the cooling units $CP_1$. There is a different wafer W having already received a predetermined heat treatment (cooling) in the cooling unit $CP_1$. The main transport mechanism $T_1$ holds the different wafer W with the unloaded holding arm 57 (holding no wafer W), takes it out of the cooling unit $CP_1$, and loads into the cooling unit $CP_1$ the wafer W having been received from the receiver $PASS_{1A}$. Then, the main transport mechanism $T_1$, holding the cooled wafer W, moves to one of the anti-reflection film coating units $BARC_1$. The cooling unit $CP_1$ starts heat treatment (cooling) of the wafer W loaded therein (step S2). This heat treatment (cooling) will have been finished by the time the main transport mechanism $T_1$ accesses this cooling unit $CP_1$ next time. The following description assumes that wafers W having received predetermined treatments are present also in the other, different heat-treating units 41 and coating units 31 when the main transport mechanism $T_1$ makes access thereto.

Accessing the anti-reflection film coating unit $BARC_1$, the main transport mechanism $T_1$ takes a wafer W having anti-reflection film formed thereon from the anti-reflection film coating unit $BARC_1$, and places the cooled wafer W on the spin holder 32 of the anti-reflection film coating unit $BARC_1$. Then, the main transport mechanism $T_1$, holding the wafer W having anti-reflection film formed thereon, moves to one of the heating and cooling units $PHP_1$. The anti-reflection film coating unit $BARC_1$ starts treatment of the wafer W placed on the spin holder 32 (step S3).

Specifically, the spin holder 32 spins the wafer W in horizontal posture, the gripper 26 grips one of the nozzles 35, the nozzle moving mechanism 37 moves the gripped nozzle 35 to a position above the wafer W, and the treating solution for anti-reflection film is supplied from the nozzle 35 to the wafer W. The treating solution supplied spreads all over the wafer W, and is scattered away from the wafer W. The cup 33 collects the scattering treating solution. In this way, the treatment is carried out for forming anti-reflection film on the wafer W.

Accessing the heating and cooling unit $PHP_1$, the main transport mechanism $T_1$ takes a wafer W having received heat treatment out of the heating and cooling unit $PHP_1$, and loads the wafer W having anti-reflection film formed thereon into the heating and cooling unit $PHP_1$. Then, the main transport mechanism $T_1$, holding the wafer W taken out of the heating and cooling unit $PHP_1$, moves to one of the cooling units $CP_1$. The heating and cooling unit $PHP_1$ receives a wafer W successively on the two plates 43, to heat the wafer W on one of the plates 43 and then to cool the wafer W on the other plate 43 (step S4).

Having moved to the cooling unit $CP_1$, the main transport mechanism $T_1$ takes a wafer W out of the cooling unit $CP_1$, and loads the wafer W held by the transport mechanism $T_1$ into the cooling unit $CP_1$. The cooling unit $CP_1$ cools the wafer W loaded therein (step S5).

Then, the main transport mechanism $T_1$ moves to one of the resist film coating units $RESIST_1$. The main transport mechanism $T_1$ takes a wafer W having resist film formed thereon from the resist film coating unit $RESIST_1$, and loads the wafer W held by the main transport mechanism $T_1$ into the resist film coating unit $RESIST_1$. The resist film coating unit $RESIST_1$ supplies the resist film material while spinning the wafer W loaded therein, to form resist film on the wafer W (step S6).

The main transport mechanism $T_1$ further moves to one of the heating and cooling units $PHP_1$ and one of the cooling units $CP_1$. The main transport mechanism $T_1$ loads the wafer W having resist film formed thereon into the heating and cooling unit $PHP_1$, transfers a wafer W treated in the heating and cooling unit $PHP_1$ to the cooling unit $CP_1$, and receives a wafer W treated in the cooling unit $CP_1$. The heating and cooling unit $PHP_1$ and cooling unit $CP_1$ carry out predetermined treatments of newly loaded wafers W, respectively (steps S7 and S8).

The main transport mechanism $T_1$ moves to the receiver $PASS_2$, places the wafer W it is holding on the receiver $PASS_{2A}$ (step S9), and receives a wafer W present on the receiver $PASS_{2A}$ (step S21).

Subsequently, the main transport mechanism $T_1$ accesses the receiver $PASS_1$ again, and repeats the above operation. This operation is controlled by the second controller 94. As a result, the main transport mechanism $T_1$ receives a wafer W from the receiver $PASS_1$ and transports the wafer W to a predetermined treating unit (a cooling unit $CP_1$ in this embodiment), and takes a treated wafer W from this treating unit. Subsequently, the main transport mechanism $T_1$ transports the wafer W taken out to a different treating unit, and takes a treated wafer W from the different treating unit. In this way, the treatment is carried out in parallel for a plurality of wafers W by transferring a treated wafer W from each treating unit to a new treating unit. Starting with a wafer W first placed on the receiver $PASS_1$, the wafers W are successively placed on the receiver $PASS_2$ to be fed to the story K2. Similarly, the wafers W are placed on the receiver $PASS_1$ in the order of placement on the receiver $PASS_2$, to be fed to the ID section 1.

Next, operations taking place when the main transport mechanism $T_1$ cannot place the wafer W on the receiver $PASS_2$ in the above step S9 will be described.

A situation where a wafer W cannot be placed on the receiver $PASS_2$ may be caused by the receiver $PASS_2$, e.g. due to a different wafer W present on the receiver $PASS_2$. Apart from this, the cause may lie in a different component such as the main transport mechanism $T_1$, various treating units or controller 90. The wafer cannot be placed on the receiver $PASS_2$ when the main transport mechanism $T_1$ fails to operate properly, when the control section 90 does not permit the main transport mechanism $T_1$ to place the wafer W on the receiver $PASS_2$, or when the control section 90 fails to control properly. In this specification, a time when a wafer W cannot be placed on a receiver PASS will be called an abnormal time as appropriate.

Whether a wafer W can be placed on the receiver $PASS_2$ is determined by the second controller 94. The second controller 94 determines from a result of detection by the sensor Sp of the receiver $PASS_2$ whether another wafer W is present on the receiver $PASS_2$. When another wafer W is present on the receiver $PASS_2$, the second controller 94 determines that the further wafer W cannot be placed on the receiver $PASS_2$. Since the result of detection by the sensor Sp of the receiver $PASS_2$ is inputted also to the third controller 95, the same determination is made also by the third controller 95.

When the second controller 94 determines that the wafer W cannot be placed on the receiver $PASS_2$ in step S9, the main transport mechanism $T_1$ moves to the position opposed to the buffer BF2, and temporarily places the wafer W it holds on the buffer BF2. Once the wafer W is placed on the buffer BF2, the operation shifts to the ordinary substrate transporting operation of step S21 noted hereinbefore. Specifically, the main transport mechanism $T_1$ receives a wafer W from the receiver $PASS_{2B}$ (step S21), and places the received wafer W on the receiver $PASS_1$ (step S22).

After further repeating the series of operations, when a wafer W cannot be placed on the receiver $PASS_2$ in step S9 again, the main transport mechanism $T_1$ temporarily places the wafer W on the buffer BF2. The buffer BF2 can accommodate five wafers W in this embodiment. Even if the state where wafers W cannot placed on the receiver $PASS_2$ continues, the main transport mechanism $T_1$ can repeat the series of operations at least five times. This operation of the main transport mechanism $T_1$ is also controlled by the second controller 94.

Thus, even when a wafer W cannot be placed on the receiver $PASS_2$, the main transport mechanism $T_1$, by placing the wafer W on the buffer BF2, can promptly shift to operation for transporting other wafers W. Therefore, the main transport mechanism $T_1$ can continue the transporting operation in steps S21 et seq. Since the buffer BF2 is disposed adjacent the receiver $PASS_2$, the time taken in the operation for placing a wafer W on the buffer BF2 is almost the same as the time taken in the operation (step S9) for placing a wafer W on the receiver $PASS_2$. Therefore, the transporting steps, steps S21 et seq., may be resumed after step S9 without delay, compared with a schedule for the normal operation (specifically, a schedule for the case where the wafer can be placed on the receiver $PASS_2$).

Since the buffer BF2 can accommodate five wafers W, even if it becomes impossible for the main transport mechanism $T_1$ to place a wafer W on the receiver $PASS_2$ while all of the four coating units 31 are treating wafers, the wafers W can be transported successively from the coating units 31 to the heat-treating units 41. It is therefore possible to start heat treatment of each wafer W as scheduled for a normal operation. Thus, even when a wafer W cannot be placed on the receiver $PASS_2$, it is possible to prevent lowering the quality of treatment for forming film on the wafers W.

[Main Transport Mechanisms $T_2$, $T_4$]

Since operation of the main transport mechanism $T_4$ is substantially the same as operation of the main transport mechanism $T_2$, only the main transport mechanism $T_2$ will be described. The main transport mechanism $T_2$ moves to a position opposed to the receiver $PASS_2$. At this time, the main transport mechanism $T_2$ holds a wafer W received from a cooling unit $CP_2$ accessed immediately before. The main transport mechanism $T_2$ places this wafer W on the receiver $PASS_{2B}$ (step S21), and holds the wafer W present on the receiver $PASS_{2A}$ (step S9).

The main transport mechanism $T_2$ accesses the edge exposing unit $EEW_2$. The main transport mechanism $T_2$ receives a wafer W having received a predetermined treatment in the edge exposing unit $EEW_2$, and loads the cooled wafer W into the edge exposing unit $EEW_2$. While spinning the wafer W loaded therein, the edge exposing unit $EEW_2$ irradiates peripheral regions of the wafer W with light from the light emitter not shown, thereby exposing the peripheral regions of the wafer W (step S10).

The main transport mechanism $T_2$, holding the wafer W received from the edge exposing unit $EEW_2$, accesses the receiver $PASS_5$. The main transport mechanism $T_2$ places the wafer W on the receiver $PASS_{5A}$ (step S11), and holds a wafer W present on the receiver $PASS_{5B}$ (step S16).

The main transport mechanism $T_2$ moves to one of the cooling units $CP_2$, and replaces a wafer W in the cooling unit $CP_2$ with the wafer W held by the main transport mechanism $T_2$. The main transport mechanism $T_2$ holds the wafer W having received cooling treatment, and accesses one of the developing units $DEV_2$. The cooling unit $CP_2$ starts treatment of the newly loaded wafer W (step S17).

The main transport mechanism $T_2$ takes a developed wafer W from the developing unit $DEV_2$, and places the cooled wafer W on the spin holder 77 of the developing unit $DEV_2$. The developing unit $DEV_2$ develops the wafer W placed on the spin holder 77 (step S18). Specifically, while the spin holder 77 spins the wafer W in horizontal posture, the developer is supplied from one of the slit nozzles 81a to the wafer W, thereby developing the wafer W.

The main transport mechanism $T_2$ holds the developed wafer W, and accesses one of the heating units $HP_2$. The main transport mechanism $T_2$ takes a wafer W out of the heating unit $HP_2$, and loads the wafer W it is holding into the heating unit $HP_2$. Then, the main transport mechanism $T_2$ transports the wafer W taken out of the heating unit $HP_2$ to one of the cooling units $CP_2$, and takes out a wafer W already treated in this cooling unit $CP_2$. The heating unit $HP_2$ and cooling unit $CP_2$ carry out predetermined treatments for the newly loaded wafers W, respectively (steps S19 and S20).

Subsequently, the main transport mechanism $T_2$ accesses the receiver $PASS_2$ again, and repeats the above operation. This operation is controlled by the third controller 95. As a result, the wafers W are forwarded to the receiver $PASS_{5B}$ in the order in which they are placed on the receiver $PASS_{2A}$. Similarly, the wafers W are forwarded to the receiver $PASS_{2B}$ in the order in which they are placed on the receiver $PASS_{5B}$.

Next, operations taking place when the main transport mechanism $T_1$ could not place a wafer W on the receiver $PASS_2$ in the above step S9, and placed the wafer W on the buffer BF2 instead, will be described. In this case, the third controller 95 controls the main transport mechanism $T_2$ to place the wafer W it is holding on the receiver $PASS_{2B}$ (Step S21). Then, omitting the substrate transport corresponding to step S9 of the main transport mechanism $T_2$, the third controller 95 lowers the main transport mechanism $T_2$ to the position opposed to the buffer BF2, and causes the main transport mechanism $T_2$ to hold the wafer W placed on the buffer BF2. When the wafer W has been received from the buffer BF2, the main transport mechanism $T_2$ resumes substrate transport in the above steps S10 et seq. That is, the main transport mechanism $T_2$ transports the received wafer W to the edge exposing unit $EEW_2$ (step S10).

Thus, the main transport mechanism $T_2$ can directly receive the wafer W which the main transport mechanism $T_1$ has placed on the buffer BF2. The wafer W can be transferred efficiently, compared with the case where the main transport mechanism $T_1$ places the wafer W first placed on the buffer BF2 on the receiver $PASS_2$ again, and the main transport mechanism $T_2$ receives the wafer W from the receiver $PASS_2$. Therefore, even when the main transport mechanism $T_1$ cannot place a wafer W on the receiver $PASS_2$, the wafer W can be transferred efficiently.

Next, operations taking place when the main transport mechanism $T_2$ cannot place the wafer W on the receiver $PASS_2$ in the above step S21 will be described. The third controller 95 controls the main transport mechanism $T_2$ to omit the substrate transport corresponding to step S21 of the main transport mechanism $T_2$ and place the wafer W on the buffer BF2. Subsequently, the main transport mechanism $T_2$ is made to carry out the substrate transport in the above steps S9 et seq.

It is preferable in this case that the main transport mechanism $T_1$ skips the above step S21 (to receive the wafer W from the receiver $PASS_{2B}$), accesses the buffer BF2, and receives the wafer W from the buffer BF2.

Thus, even when the main transport mechanism $T_2$ cannot place a wafer W on the receiver $PASS_2$. the main transport mechanism $T_2$, by placing the wafer W on the buffer BF2, can promptly shift to operation for transporting other wafers W. On the story K2 of the developing block Bb, therefore, a series of treatments can be carried out for a plurality of wafer W on time (as scheduled). There is no possibility of lowering the quality of development carried out for the wafers W.

[IF Transport Mechanisms $T_{IF}$—IF First Transport Mechanism $T_{IFA}$]

IF first transport mechanism $T_{IFA}$ accesses the receiver $PASS_5$, and receives the wafer W present on the receiver $PASS_{5A}$ (step S11a). IF first transport mechanism $T_{IFA}$, holding the wafer W received, moves to the receiver PASS-CP, and loads the wafer W on the receiver PASS-CP (step S12).

Next, IF first transport mechanism $T_{IFA}$ receives a wafer W from the receiver $PASS_7$ (step S14), and moves to a position opposed to one of the heating and cooling units $PHP_2$. IF first transport mechanism $T_{IFA}$ takes a wafer W having received post-exposure baking treatment (PEB) treatment from the heating and cooling unit $PHP_2$, and loads the wafer W received from the receiver $PASS_7$ into the heating and cooling unit $PHP_2$. The heating and cooling unit $PHP_2$ carries out heat treatment for the newly loaded wafer W (step S15a).

IF first transport mechanism $T_{IFA}$ transports the wafer W taken out of the heating and cooling unit $PHP_2$ to the receiver $PASS_{5B}$. Subsequently, IF first transport mechanism $T_{IFA}$ transports a wafer W from the receiver $PASS_{6A}$ to the receiver PASS-CP (Step S11b, S12). Next, IF first transport mechanism $T_{IFA}$ transports a wafer W from the receiver $PASS_7$ to one of the heating and cooling units $PHP_4$. At this time, IF first transport mechanism $T_{IFA}$ takes out a wafer W having received the post-exposure baking treatment (PEB) treatment in the heating and cooling unit $PHP_4$, and places the wafer W on the receiver $PASS_{6B}$ (steps S14, S15b, S16b).

Subsequently, IF first transport mechanism $T_{IFA}$ accesses the receiver $PASS_5$ again and repeats the above operation. This operation is controlled by the sixth controller 98.

Next, operations taking place when IF first transport mechanism $T_{IFA}$ cannot place the wafer W in receiver $PASS_{5B}$ in the above step S16 will be described. The sixth controller 98 controls IF first transport mechanism $T_{IFA}$ to omits the substrate transport by IF first transport mechanism $T_{IFA}$ corresponding to step S16, and place the wafer W on the return buffer $BF_{IFB}$. Subsequently, the sixth controller 98 causes IF first transport mechanism $T_{IFA}$ to carry out the transport in the above steps S11b and S12 et seq.

Thus, even when IF first transport mechanism $T_{IFA}$ cannot place a wafer W on the receiver $PASS_{5B}$, IF first transport mechanism $T_{IFA}$, by placing the wafer W on the return buffer $BF_{IFB}$, can successively unload wafers W having undergone post-exposure baking (PEB) treatment from the heating and cooling units $PHP_2$ on time. Therefore, even when a wafer W cannot be placed on the receiver $PASS_{5B}$, the post-exposure baking (PEB) treatment can be carried out for wafers W effectively.

[IF Transport Mechanisms $T_{IF}$—IF Second Transport Mechanism $T_{IFB}$]

IF second transport mechanism $T_{IFB}$ takes a wafer W out of the receiver PASS-CP, and transports it to the exposing machine EXP. Then, IF second transport mechanism $T_{IFB}$ receives an exposed wafer W from the exposing machine EXP, and transports it to the receiver $PASS_2$ (step S13).

Subsequently, IF second transport mechanism $T_{IFB}$ accesses the receiver PASS-CP again and repeats the above operation.

In the substrate treating apparatus according to this embodiment, as described above, the receivers $PASS_2$ and $PASS_4$ have the buffers BF2 and BF4 corresponding thereto, respectively. Even when the main transport mechanism $T_1$ or $T_3$ cannot place a wafer W on the receiver $PASS_2$ or $PASS_4$, the main transport mechanism $T_1$ or $T_3$ can place that wafer W on the buffer BF2 or BF4. Thus, the main transport mechanism $T_1$ or $T_3$ can continue transporting wafers W. Even if other wafers W are being treated in the film forming section (coating units 31 and heat-treating units 41) when the main transport mechanism $T_1$ or $T_3$ becomes incapable of placing a wafer W on the receiver $PASS_2$ or $PASS_4$, a series of treatments including coating treatment and heat treatment can be continued for those other wafers W on time. Thus, there is no possibility of lowering the quality of treatment to form film (resist film and anti-reflection film) on the wafers W.

Since the buffers BF2 and BF4 are arranged adjacent the receivers $PASS_2$ and $PASS_4$, respectively, an amount of movement required for the main transport mechanism $T_1$ or $T_3$ to access the buffer BF2 or BF4 does not differ greatly from an amount of movement required to access the receiver $PASS_2$ or $PASS_4$. Therefore, a time taken when accessing the buffer BF2 or BF4 can be made substantially the same as the time taken to access the receiver $PASS_2$ or $PASS_4$. This allows the main transport mechanism $T_1$ or $T_3$ to carry out a subsequent transporting operation according to normal schedule.

The buffers BF2 and BF4 are open also in the direction accessed by the main transport mechanisms $T_2$ and $T_4$, respectively. Thus, the main transport mechanism $T_2$ or $T_4$ can receive a wafer W temporarily placed on the buffer BF2 or BF4. Even when the main transport mechanism $T_1$ or $T_3$ places a wafer W on the buffer BF2 or BF4, the wafer W can be transferred efficiently from the main transport mechanism $T_1$ or $T_3$ to the main transport mechanism $T_2$ or $T_4$.

Even when the main transport mechanism $T_2$ or $T_4$ of the treating block Bb cannot place a wafer W on the receiver $PASS_2$ or $PASS_4$, the main transport mechanism $T_1$ or $T_3$ also can place that wafer W on the buffer BF2 or BF4. Thus, wafers W can receive high-quality developing treatment in the treating block Bb.

Each buffer BF2 or BF4 can accommodate a larger number of wafers W than the number of coating units 31. Thus, even if wafers W are being treated in all the coating units 31 when it becomes impossible for the main transport mechanism $T_2$ or $T_4$ to place a wafer W on the receiver $PASS_2$ or $PASS_4$, all these wafers W under treatment can receive the series of treatment following the coating treatment according to a predetermined schedule. This prevents lowering in the quality of treatment for forming film on these wafers W.

Since each of the receivers $PASS_1$-$PASS_6$ has a sensor Sp for detecting presence or absence of a wafer W, the control section 90 (specifically, the controllers 93-99) can determine properly whether a wafer W can be placed on each of the receivers $PASS_1$-$PASS_6$.

The treating section 3 is divided into the two, upper and lower, stories, and wafers W can receive a series of treatments in parallel on the respective stories. Thus, the apparatus has an increased throughput. The treating section 3 has a layered structure with the stories arranged one over the other. The stories are arranged vertically as are the main transport mechanism $T_1$ and main transport mechanism $T_3$, for example. This arrangement can avoid an enlarged installation area of this apparatus.

This invention is not limited to the foregoing embodiment, but may be modified as follows:

(1) In the foregoing embodiment, the buffer BF2 is stacked under the receiver $PASS_2$, but the invention is not limited to this. For example, the buffer BF2 may be disposed over the receiver $PASS_2$, or may be juxtaposed with the receiver $PASS_2$. Even with such a modification, the main transport mechanism $T_1$ can easily access the buffer BF2. A similar modification may be made to the buffer BF4.

(2) In the foregoing embodiment, the buffer BF2 is open at opposite ends facing the main transport mechanism $T_1$ and main transport mechanism $T_2$ to be accessible also to the main transport mechanism $T_2$. The invention is not limited to this construction. For example, the buffer BF2 may be open only at the end facing the main transport mechanism $T_1$ to be accessible only to the main transport mechanism $T_1$. A similar modification may be made to the buffer BF4.

(3) In the foregoing embodiment, each of the buffers BF2 and BF4 has been described as capable of accommodating five wafers W. This is not limitative. Instead, for example, the buffer BF2 may be modified to accommodate at least the number of wafers W that can be treated simultaneously in the film forming section on the story K1. Similarly, the buffer BF4 may be modified to accommodate at least the number of wafers W that can be treated simultaneously in the film forming section on the story K3. This construction allows all the wafers W that can be treated simultaneously in the film forming section to be temporarily placed on the buffers BF2 and BF4. Therefore, whenever timing causes wafers W to be incapable of being placed on the receiver $PASS_2$ or receiver $PASS_4$, these wafers W can be placed on the buffer BF2 or BF4 after continuing a series of treatments including coating treatment and heat treatment on time for all the wafers W treated in the film forming section.

Alternatively, the buffer BF2 may be modified to accommodate the number of wafers W at least corresponding to the sum of the number of coating units 31 on the story K1 and the number of developing units DEV on the story K2. Similarly, the buffer BF2 may be modified by taking into account the number of developing units DEV on the story K4. With this construction, even when it becomes impossible for the main transport mechanism $T_2$ or $T_4$ of the treating block Bb to place wafers W on the receiver $PASS_2$ or receiver $PASS_4$, the wafers W treated in the developing units DEV then can be developed with high quality.

(4) In the foregoing embodiment, the control section 90 determines presence or absence of a wafer W on each of the receivers $PASS_1$-$PASS_6$ based on a result of detection by a sensor Sp. The invention is not limited to this. Instead, for example, it may be determined from controls of the main transport mechanisms $T_1$ and $T_2$ carried out by the second and third controllers 94 and 95, whether the main transport mechanism $T_2$ has received a wafer W from the receiver $PASS_2$ after the main transport mechanism $T_1$ placed the wafer W on the receiver $PASS_2$. If the wafer W has been received, it may be determined that the receiver $PASS_2$ has no wafer W (i.e. is vacant).

(5) Although each of the buffers BF2, BF4 and BFIF similarly has a sensor for detecting presence or absence of a wafer W, the sensor may be omitted as appropriate as long as whether each buffer BF is loaded with a wafer W can be determined.

(6) In the foregoing embodiment, the treating block Ba includes the anti-reflection film coating units BARC. The invention is not limited to this. A treating block including anti-reflection film coating units may be provided separately from the treating block Ba. Or the anti-reflection film coating units BARC may be omitted.

(7) In the foregoing embodiment, the treating section 3 has a layered structure with two, upper and lower, stories. The invention is not limited to this. The treating section 3 may be divided into three or more stories. Or it is not necessary for the treating section 3 to have a layered structure (i.e. the treating section 3 may consist of one story).

Figure 13:
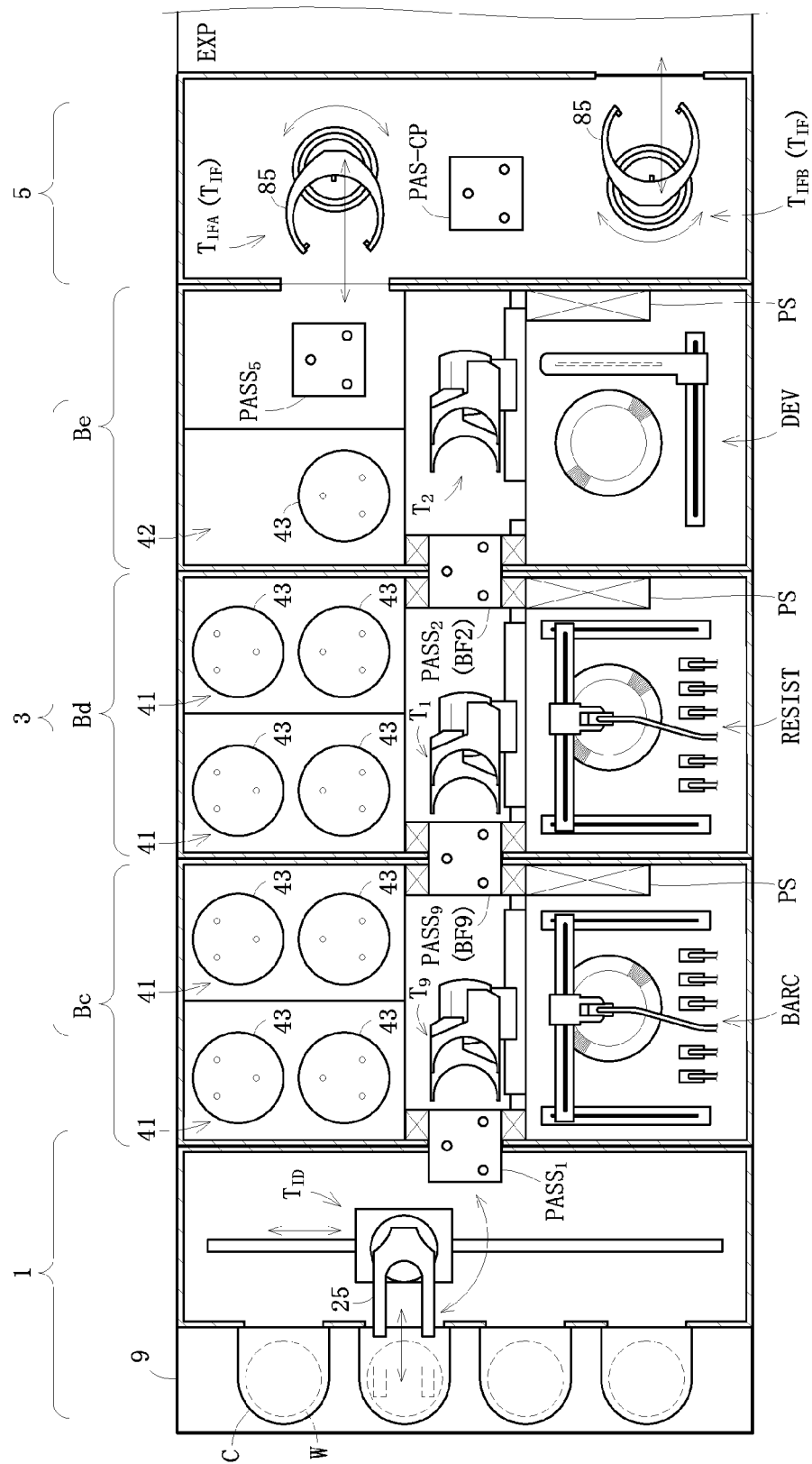
FIG. 13 is a plan view showing an outline of a modified substrate treating apparatus.

The modifications in paragraphs (6) and (7) above will be described with reference to FIG. 13. FIG. 13 a plan view showing an outline of a modified substrate treating apparatus. Like reference numerals are used to identify like parts which are the same as in the foregoing embodiment and will not be described again.

As shown, the treating section 3 may be modified to include three treating blocks B arranged horizontally. Specifically, an anti-reflection film coating block Bc, a resist film coating block Bd and a developing block Be are arranged in order from the ID section 1, with the developing block Be disposed adjacent the IF section 5.

The anti-reflection film coating block Bc has an anti-reflection film coating unit BARC, heat-treating units 41, and a main transport mechanism $T_9$ for transporting wafers W to and from the anti-reflection film coating unit BARC and heat-treating units 41.

The resist film coating block Bd has a resist film coating unit RESIST, heat-treating units 41 and a main transport mechanism $T_1$ for transporting wafers W to and from the resist film coating unit RESIST and heat-treating units 41.

The developing block Be has a developing unit DEV, heat-treating units 42, an edge exposing unit EEW and a main transport mechanism $T_2$.

A receiver $PASS_9$ is provided between the anti-reflection film coating block Bc and resist film coating block Bd. The receiver $PASS_9$ is used to transfer wafers W between the main transport mechanism $T_3$ and main transport mechanism $T_1$. A buffer BF9 is provided adjacent the receiver $PASS_9$. When the main transport mechanism $T_3$ cannot place a wafer W on the receiver $PASS_9$, the wafer W is temporarily placed on the buffer BF9. The main transport mechanism $T_3$ corresponds to the third main transport mechanism in this invention. The receiver PASS₉ corresponds to the third receiver in this invention. The buffer BF9 corresponds to the third buffer in this invention.

Each of the above treating blocks Bc-Be is not divided into a plurality of stories. Therefore, the treating section 3 does not have a layer structure with a plurality of stories (it has a single-story structure).

In such modified embodiment, since the receiver PASS₉ has the buffer BF9 corresponding thereto, even when the main transport mechanism T₃ cannot place a wafer W on the receiver PASS₉, the main transport mechanism T9 can place the wafer W on the buffer BF9. Thus, the main transport mechanism T9 can continue transporting wafers W. The anti-reflection film coating block Bc can effectively carry out treatment for forming anti-reflection film on the wafers W.

(8) In the foregoing embodiment, the films formed on the wafers W in the treating block Ba are resist film and anti-reflection film. The invention is not limited to this. A modification may be made to form other types of film on the wafers W.

(9) In the foregoing embodiment, each of the receivers PASS₁-PASS₆ has a plurality of (two) receivers, and one of the receivers PASS is selected according to a direction for transferring wafers W. The invention is not limited to this. Each of the receivers PASS₁-PASS₆ may consist of a single receiver. In this case, wafers W transferred in whichever direction may be placed on the single receiver PASS.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a plurality of substrates comprising:
    an indexer section;
    a treating section;
    one or more receivers; and
    one or more buffers;
    wherein the treating section has a plurality of stories arranged vertically, each story including:
        one or more coating units providing a coating treatment to the plurality of substrates with one or more treating solutions;
        one or more heat-treating units providing a heat treatment to the plurality of substrates; and
        a first main transport mechanism for transporting the plurality of substrates to and from the one or more coating units and the one or more heat-treating units;
    wherein the one or more coating units, the one or more heat-treating units and the first main transport mechanism being in the same arrangement on each respective story in the plurality of stories in plain view;
    wherein the one or more receivers are installed on each respective story;
    wherein the one or more buffers are installed on each respective story;
    wherein the indexer section is arranged to transport the plurality of substrates alternately to each respective story; and
    wherein on each story:
        the first main transport mechanism is arranged to transport the plurality of substrates received from the indexer section to the one or more coating units and the one or more heat-treating units, and place on the one or more receivers the plurality of substrates having a film formed thereon, and during a period of an abnormality when the first main transport mechanism cannot place the plurality of substrates on the one or more receivers, the first main transport mechanism temporarily places on the one or more buffers the plurality of substrates having the film formed thereon while a series of treatments including the coating treatment in the one or more coating units and the heat treatment in the one or more heat-treating units is continued according to a predetermined schedule for the plurality of substrates being treated at a time when the abnormality arose.

2. The substrate treating apparatus according to claim 1, wherein
    the one or more coating units are arranged on one side of a transporting space in which the first main transport mechanism is installed; and
    the one or more heat-treating units are arranged on the other side of the transporting space.

3. The substrate treating apparatus according to claim 1, wherein an arrangement of the one or more coating units and the one or more heat-treating units as seen from the first main transport mechanism identical on the respective stories.

4. The substrate treating apparatus according to claim 1, wherein the first main transport mechanism is arranged to place the plurality of substrates on the one or more receivers in order to transfer the plurality of substrates to a different main transport mechanism.

5. The substrate treating apparatus according to claim 1, wherein, at the time of the abnormality, the first main transport mechanism cannot place the plurality of substrates on the one or more receivers by a command prohibiting delivery to the one or more receivers.

6. The substrate treating apparatus according to claim 1, wherein, during a normal operation, the plurality of substrates are placed only on the one or more receivers, and the plurality of substrates are not placed on the one or more buffers.

7. The substrate treating apparatus according to claim 1, wherein the series of treatments carried out during the period of the abnormality is the same as a series of treatments carried out during a normal operation.

8. The substrate treating apparatus according to claim 1, wherein the series of treatments carried out during the period of the abnormality includes the coating treatment, the heating treatment and a cooling treatment carried out in the stated order.

9. The substrate treating apparatus according to claim 1, wherein during a normal operation, the plurality of substrates receive identical treatments on the respective stories.

10. The substrate treating apparatus according to claim 1, comprising a controller for controlling the first main transport mechanism to place the plurality of substrates on the one or more receivers during a normal operation, and to place the plurality of substrates temporarily on the one or more buffers during the period of the abnormality.

11. A substrate treating apparatus comprising:
    an indexer section;
    a resist film coating block;
    one or more receivers; and
    one or more buffers;
    wherein the resist film coating block has a plurality of stories arranged vertically, each story including:
        one or more coating units providing a coating treatment for a plurality of substrates with one or more treating solutions;
        one or more heat-treating units providing a heat treatment for the plurality of substrates; and a first main transport mechanism for transporting the plurality of substrates to and from the one or more coating units and the one or more heat-treating units;

wherein the one or more coating units, the one or more heat-treating units and the first main transport mechanism being in the same arrangement on each respective story in plain view;

wherein the one or more receivers are installed on each respective story;

wherein the one or more buffers are installed on each respective story;

wherein the indexer section is arranged to transport the plurality of substrates alternately to each story; and wherein on each story, the first main transport mechanism is arranged to transport the plurality of substrates received from the indexer section to the one or more coating units and the one or more heat-treating units, and place on the one or more receivers the plurality of substrates having film formed thereon; and during an abnormal operation when the first main transport mechanism cannot place the plurality of substrates on the one or more receivers, the first main transport mechanism temporarily places on the one or more buffers the plurality of substrates having film formed thereon while a series of treatments including the coating treatment in the one or more coating units and the heat treatment in the one or more heat-treating units is continued according to a predetermined schedule for the plurality substrates being treated when the abnormal operation occurred.

12. The substrate treating apparatus according to claim 11, wherein the one or more coating units are arranged on one side of a transporting space in which the first main transport mechanism is installed; and the one or more heat-treating units are arranged on the other side of the transporting space.

13. The substrate treating apparatus according to claim 11, wherein an arrangement of the one or more coating units and the one or more heat-treating units as seen from the first main transport mechanism is identical on each respective story.

14. The substrate treating apparatus according to claim 11, wherein the first main transport mechanism is arranged to place the plurality of substrates on the one or more receivers in order to transfer the plurality of substrates to a different main transport mechanism.

15. The substrate treating apparatus according to claim 11, wherein during the abnormal operation, the first main transport mechanism cannot place the plurality of substrates on the one or more receivers by a command prohibiting delivery to the one or more receivers.

16. The substrate treating apparatus according to claim 11, wherein during a normal operation, the plurality of substrates are placed only on the one or more receivers, and the plurality of substrates are not placed on the one or more buffers.

17. The substrate treating apparatus according to claim 11, wherein the series of treatments carried out during the abnormal operation is the same as a series of treatments carried out during a normal operation.

18. The substrate treating apparatus according to claim 11, wherein the series of treatments carried out during the abnormal operation includes the coating treatment first, followed by the heating treatment and lastly a cooling treatment.

19. The substrate treating apparatus according to claim 11, wherein a normal operation, the plurality of substrates receive the same treatments on each respective story.

20. The substrate treating apparatus according to claim 11, comprising a controller for controlling the first main transport mechanism to place the plurality of substrates on the one or more receivers during a normal operation, and to place the plurality of substrates temporarily on the one or more buffers during the abnormal operation.

* * * * *